(12) United States Patent
Miura

(10) Patent No.: US 12,719,231 B2
(45) Date of Patent: Aug. 25, 2026

(54) LIGHT EMITTING DEVICE

(71) Applicant: NICHIA CORPORATION, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 676 days.

(21) Appl. No.: 18/183,482

(22) Filed: Mar. 14, 2023

(65) Prior Publication Data

US 2023/0299554 A1 Sep. 21, 2023

(30) Foreign Application Priority Data

Mar. 15, 2022 (JP) ................................ 2022-040825
Mar. 9, 2023 (JP) ................................ 2023-036281

(51) Int. Cl.
*H01S 5/02255* (2021.01)
*H01S 5/02253* (2021.01)
*H01S 5/42* (2006.01)

(52) U.S. Cl.
CPC ...... *H01S 5/02255* (2021.01); *H01S 5/02253* (2021.01); *H01S 5/423* (2013.01)

(58) Field of Classification Search
CPC .. H01S 5/02255; H01S 5/02253; H01S 5/423; H01S 5/4012; H01S 5/04257; H01S 5/0683
See application file for complete search history.

(56) References Cited

U.S. PATENT DOCUMENTS

2004/0066815 A1 4/2004 Okazaki
2009/0207619 A1 8/2009 Park
2011/0170831 A1 7/2011 Tamura
2019/0212571 A1 7/2019 Ohl et al.
2023/0035957 A1* 2/2023 Miyata .................. H01S 5/0225
2024/0231077 A1* 7/2024 Yamamoto ............. G02B 26/10

FOREIGN PATENT DOCUMENTS

JP 2002-243990 A 8/2002
JP 2004-128273 A 4/2004
JP 2007-094193 A 4/2007
JP 2007-288014 A 11/2007
JP 2011-142268 A 7/2011
JP 2012-134531 A 7/2012

* cited by examiner

*Primary Examiner* — Yuanda Zhang
(74) *Attorney, Agent, or Firm* — Foley & Lardner LLP

(57) ABSTRACT

A light emitting device includes: a package including upper and lower portions, and one or more lateral portions including a first lateral portion having a light-transmitting portion, the package having a closed space; a first light-emitting element having an upper surface, configured to have one or more emission points on the upper surface, and disposed on a mounting surface of the lower portion; and a reflecting part having a first reflection surface within the closed space to reflect light emitted upward from the emission points. Light reflected from the first reflection surface is transmitted through the light-transmitting portion. In a direction normal to the mounting surface, a first distance between a lower surface of the upper portion and the mounting surface is equal to or greater than 1.5 times a second distance between the upper surface of the first light-emitting element and a midpoint of the first reflection surface.

20 Claims, 22 Drawing Sheets

200
14b
33
30a
32
31
15
14
13,13-2
10a
L
30
10b
13-2a
16
20e
V
13,13-1
11,12
Y
Z
X
41
40
20a
20
50
11M,11Ma 11M,11Ma
41
40
40
40
11
50
20
Z
X
Y
20
20
31
20e
20a 203
30
60
hg
70,71
10
15
12
91
Y
Z
X
11M
40
50
20

70
400
XX
14
10
13
11
XX
Y
Z
X 11M,11Ma
11M,11Mb
60
Y
Z
X
11,12
30
70,71
70,71
70,71
60 60

LIGHT EMITTING DEVICE

CROSS-REFERENCE TO RELATED APPLICATION

This application claims priority to Japanese Patent Application No. 2022-040825, filed on Mar. 15, 2022, and Japanese Patent Application No. 2023-036281, filed on Mar. 9, 2023, the disclosures of which are hereby incorporated by reference in their entireties.

BACKGROUND

The present disclosure relates to a light emitting device.

Optical modules that include vertical-cavity surface-emitting laser elements are known. Japanese Patent Publication No. 2011-142268 discloses an optical module that includes: a substrate; a vertical-cavity surface-emitting laser element mounted on the substrate; and a transparent member that is disposed on the substrate to cover the vertical-cavity surface-emitting laser element. The transparent member has a reflection surface configured to laterally reflect light emitted upward from the vertical-cavity surface-emitting laser element.

SUMMARY

There are needs for reduction in size of a light emitting device.

In an illustrative and non-limiting embodiment, a light emitting device according to the present disclosure includes: a package including an upper portion, a lower portion, and one or more lateral portions, the package having a closed space defined by the upper portion, the lower portion, and the one or more lateral portions; a first light-emitting element having an upper surface and configured to have one or more emission points on the upper surface, the first light-emitting element being disposed on a mounting surface of the lower portion; and a reflecting part having a first reflection surface to reflect light emitted upward from the one or more emission points. The first reflection surface is located within the closed space. The one or more lateral portions include a first lateral portion having a light-transmitting portion. Light reflected from the first reflection surface is transmitted through the light-transmitting portion to be emitted outside. In a direction normal to the mounting surface, a first distance between a lower surface of the upper portion and the mounting surface is equal to or greater than 1.5 times a second distance between the upper surface of the first light-emitting element and a midpoint of the first reflection surface.

According to an embodiment of the present disclosure, a light emitting device can be provided in which a size of a package can be reduced.

DETAILED DESCRIPTION

Figure 1:
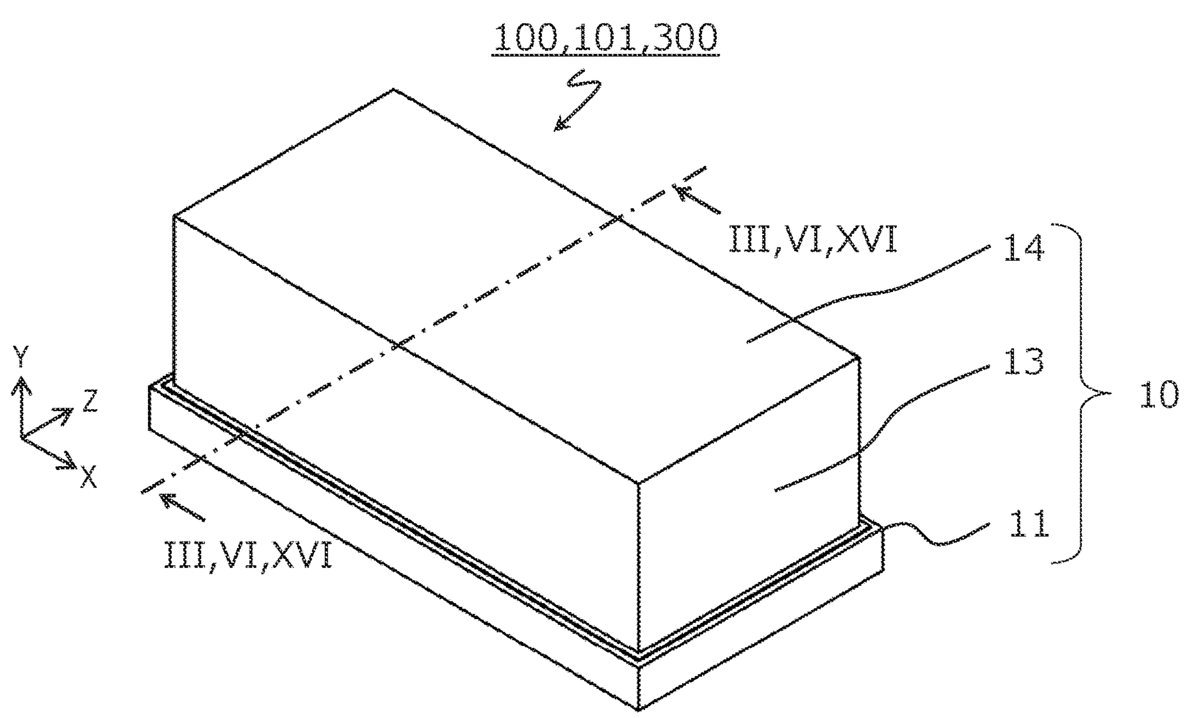
FIG. 1 is a perspective view of light emitting devices according to a first embodiment and a third embodiment of the present disclosure.

In the present specification and claims, a polygonal shape, such as a triangle, quadrangle, or the like, is not limited to the polygonal shape in a mathematically strict sense, and includes those shapes with modifications such as rounded, beveled, angled, or reverse-rounded corners. Similarly, not only shapes with such modifications at corners (ends of sides) but also shapes with modifications at intermediate portions of sides will be similarly referred to as polygonal shapes. In other words, a polygon-based shape with a partial modification is included in the term “polygonal shape” disclosed in the present specification and the claims.

This applies to not only polygons, but also terms that describes a specific shape, such as a trapezoidal, circular, recessed, or projected shape. This also applies when describing a side forming a shape. That is, even if an end or an intermediate portion of a side is modified, the modified portion is interpreted as a portion of the “side.” When “polygonal shapes” and “sides” without such modification are intended to be distinguished from those with modifications, the term “in a strict sense” may be added, and may be referred to as terms such as “a quadrangular shape in a strict sense.”

In the present specification and claims, when there are a plurality of components denoted by a certain name and these components are to be distinguished from each other, ordinal numbers such as “first,” “second,” or the like may be added before these components. For example, a claim may recite that “light emitting elements are disposed on a substrate,” while the specification may state that “a first light emitting element and a second light emitting element are disposed on a substrate.” The ordinal numbers, such as “first” and “second,” are merely used to distinguish two light emitting elements. There may be a case in which the same term with the same ordinal number does not refer to the same component in the specification as in the claims. For example, when there are components specified by terms “first light emitting element,” “second light emitting element,” and “third light emitting element” in the specification, terms “first light emitting element” and “second light emitting element” recited in claims may correspond to the “first light emitting element” and the “third light emitting element,” respectively, in the specification. Furthermore, for example, in the case in which a term “first light emitting element” is used but a term “second light emitting element” is not used in claim 1, claim 1 encompasses a configuration including a single light emitting element, and the light emitting element recited in claim 1 is not limited to refer to a “first light emitting element” in the specification, but may refer to a “second light emitting element” or a “third light emitting element” in the specification.

In the present specification and claims herein, terms indicating directions or positions (e.g., “upper/upward,” “lower/downward,” “right/rightward,” “left/leftward,” “front,” and “rear”) may be used. These terms, however, are merely used for ease of understanding of relative directions or positions in the drawings being referenced. As long as the relative relationship between the directions or the positions indicated with the terms such as “upper,” “lower,” or the like is the same as those in a referenced drawing, the layout of the elements in drawings outside of the present disclosure, or actual products and manufacturing equipment outside of the present disclosure, does not have to be the same as that shown in the referenced drawing.

The dimensions, dimensional ratio, shapes, interspace of arrangement, etc. of any components shown in a drawing may be exaggerated for ease of understanding. In order to avoid excessive complexity of the drawings, certain elements may be omitted from illustration.

Hereinafter, certain embodiments of the present invention will be described with reference to the drawings. The embodiments to be described below are intended to give a concrete form to the technological idea of the present invention, and are not intended to limit the present invention thereto. The numerical values, shapes, and materials shown in the description of the embodiments are merely examples, and various modifications can be made so long as there is no technical contradiction. In the following description, components designated by the same name or reference numerals indicate the same or the same type of elements, and repetitive explanations of those elements may be omitted.

A light emitting device according to the present embodiment of the present disclosure includes: a package having an upper portion, a lower portion, and one or more lateral portions; one or more light-emitting elements; and a reflecting part. As will be described later, the light emitting device may further include at least one of the following components: a light-receiving element, a submount, a lens member, and a beam combiner. Furthermore, depending on the product specifications, for example, the light emitting device may also include protection elements, e.g., Zener diodes, and/or temperature measurement elements for measuring internal temperature, e.g., thermistors. However, these components are not necessarily employed.

In a light emitting device according to the present embodiment of the present disclosure, one or more light-emitting elements and a reflecting part are disposed within a closed space that is defined by the upper portion, the lower portion, and the one or more lateral portions. Light emitted upward from the one or more light-emitting elements disposed on the lower portion is reflected in a lateral direction at a reflection surface of the reflecting part disposed above the light-emitting element(s), travels in the lateral direction within the defined closed space, and is transmitted through a light-transmitting portion of at least one of the one or more lateral portions to be emitted outside.

First Embodiment

With reference to FIG. 1 to FIG. 7, an example structure of a light emitting device according to a first embodiment of the present disclosure will be described. The following description will illustrate an example configuration of a light emitting device that includes three light-emitting elements; however, the quantity of light-emitting elements is not limited thereto, and one, two, or four or more light-emitting elements may be employed.

Figure 2:
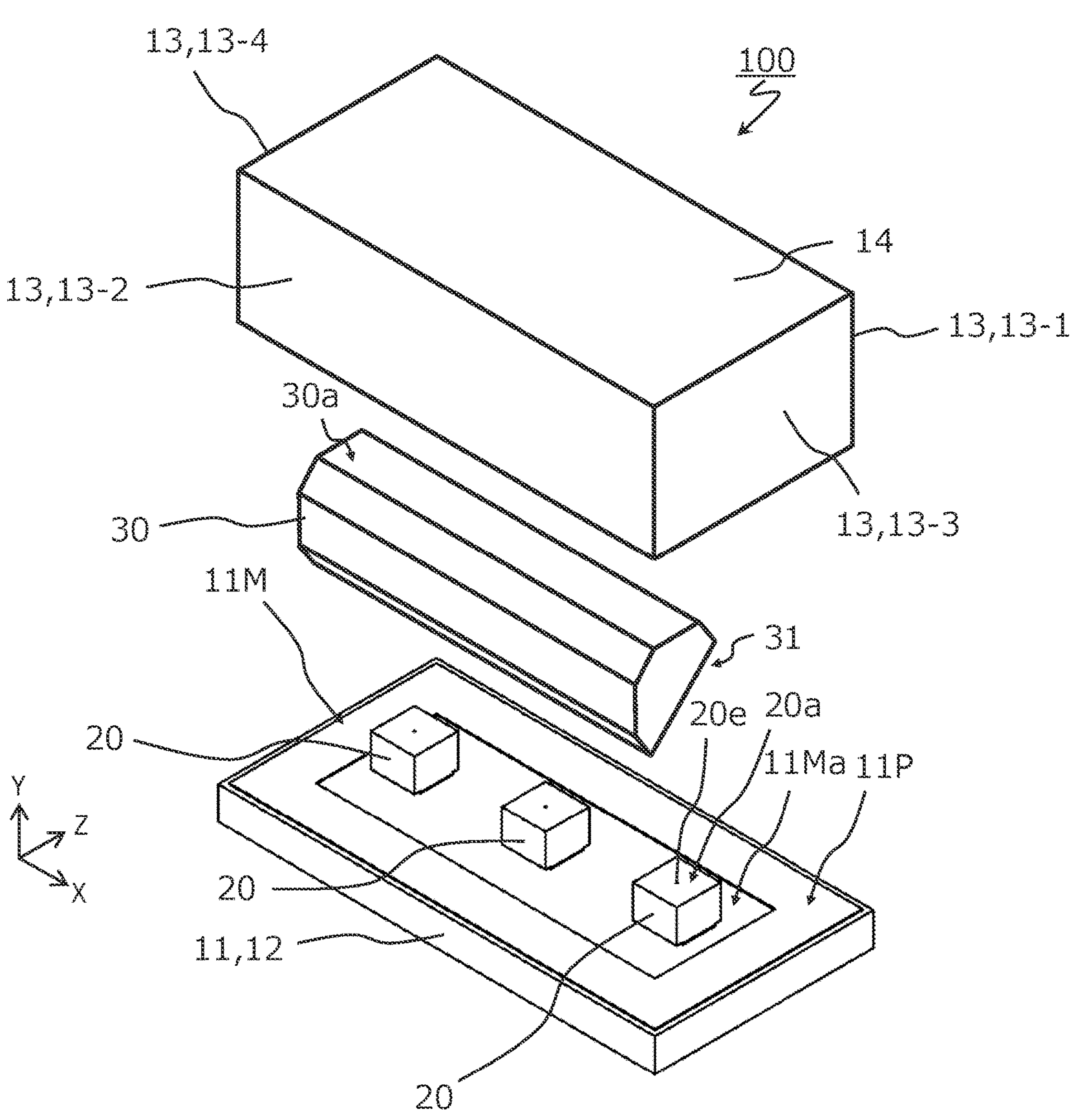
FIG. 2 is an exploded perspective view of a light emitting device according to the first embodiment of the present disclosure.
Figure 3:
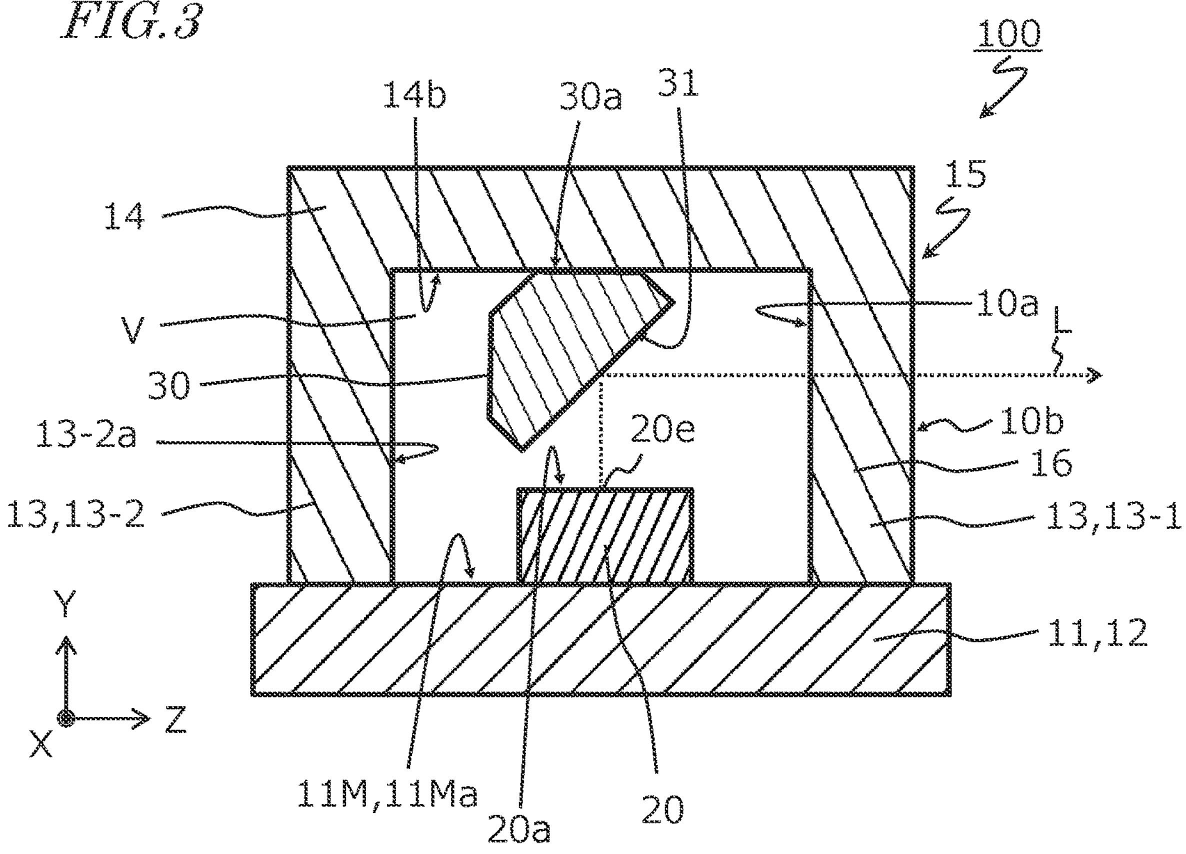
FIG. 3 is a cross-sectional view of the light emitting device along a cross-sectional line III-III in FIG. 1.

FIG. 1 to FIG. 3 are diagrams for describing a basic configuration of the light emitting device according to the first embodiment. In the attached drawings, the X axis, the Y axis, and the Z axis, which are orthogonal to one another, are shown for reference sake. Hereinafter, the directions along the X axis, the Y axis, and the Z axis, respectively, will be denoted as the X direction, the Y direction, and the Z direction. In the present specification, the Z direction is a direction in which light from each light-emitting element is emitted outside of the package, and the Y direction is a direction perpendicular to (normal to) the mounting surface of the lower portion. The expression "in a top view" in the present specification refers to a top view when viewed in a direction perpendicular to the mounting surface of the lower portion (i.e., viewed downward in the Y direction).

FIG. 1 is a schematic perspective view of the light emitting device 100 according to the first embodiment. FIG. 2 is a schematic exploded perspective view of the light emitting device 100. FIG. 3 is a schematic cross-sectional view of the light emitting device 100 along a cross-sectional line III-III in FIG. 1. In FIG. 3, an optical axis L of light that is emitted from a light-emitting element 20 is indicated with an arrow in dotted line.

The light emitting device 100 according to the first embodiment has a substantially box shape. The light emitting device 100 may have a size along the X direction of e.g., 1 mm or more. The light emitting device 100 may have a size along the Z direction of e.g., 0.8 mm or more. The light emitting device 100 may have a size along the Y direction of e.g., 0.6 mm or more. The light emitting device 100 may have a size along the X direction of e.g., 15 mm or less. The light emitting device 100 may have a size along the Z direction of e.g., 10 mm or less. The light emitting device 100 may have a height along the Y direction of e.g., 4 mm or less.

First, each component will be described.

Package 10

A package 10 includes: a lower portion 11 having a mounting surface 11M; one or more lateral portions 13 connected to the lower portion 11 and extend upward; and an upper portion 14 connected to the one or more lateral portions 13. In the illustrated example, the one or more lateral portions 13 are connected to the mounting surface 11M of the lower portion 11. The package 10 is formed of: a substrate 12 having e.g., a flat-plate shape; and a cap 15 in which the one or more lateral portions 13 and the upper portion 14 are formed or assembled as a single body.

The lower portion 11 includes an upper surface and a lower surface opposite to the upper surface. The upper surface of the lower portion 11 serves as the mounting surface 11M of the light emitting device 100 illustrated in FIGS. 1 to 3. The mounting surface 11M may be a flat surface. The mounting surface 11M includes a first mounting region 11Ma in which one or more components may be disposed. In the illustrated example, the lower portion 11 is included in the substrate 12. The substrate 12 may be made of a ceramic as a main material thereof. Examples of ceramics include aluminum nitride, silicon nitride, aluminum oxide, and silicon carbide.

The mounting surface 11M of the lower portion 11 further includes a peripheral region 11P. The peripheral region 11P is located around the first mounting region 11Ma on the mounting surface 11M. The peripheral region 11P may be a region to which the one or more lateral portions 13 are to be connected. In the illustrated example, the peripheral region 11P is a region to which the cap 15 is to be bonded. A metal film for this bonding may be formed in the peripheral region 11P.

Inside the package 10, a closed space V is defined by the lower portion 11, the one or more lateral portions 13, and the upper portion 14. The closed space V may be a sealed space, and may be in an airtight state. In the illustrated example, the substrate 12 and the cap 15 together form the closed space V. The cap 15 has a rectangular outer shape in a top view. However, the outer shape of the cap 15 in a top view does not need to be rectangular, but may be a polygonal shape other than quadrangular shapes, or a circular shape, for example. The substrate 12 and the cap 15 of the package 10 may have a shape other than the illustrated shapes.

The one or more lateral portions 13 surrounds the first mounting region 11Ma of the lower portion 11, and extend upward from the mounting surface 11M. The one or more components to be disposed on the first mounting region 11Ma are surrounded by the one or more lateral portions 13. The upper portion 14 is located above the mounting surface 11M, and is connected to the one or more lateral portions 13. The upper portion 14 has a lower surface 14*b* facing the mounting surface 11M of the lower portion 11 (upper surface).

In the cap 15 illustrated in FIG. 3 and other drawings, the one or more lateral portions 13 and the upper portion 14 are monolithically formed together using the same material as a main material. The cap 15 is made of a light-transmissive material such as glass, plastic, quartz, or sapphire, and can be made by using a processing technique such as etching, for example. Alternatively, the cap 15 may be formed by separately by forming the lateral portion(s) 13 and the upper portion 14 using different material as their respective main materials, and then bonding them together. For example, the main material of the one or more lateral portions 13 may be a light-transmissive material such as glass, while the main material of the upper portion 14 may be a non-light-transmissive material such as a monocrystalline or polycrystalline silicon.

The one or more lateral portions 13 may have one or more outer lateral surfaces. At least one of the one or more outer lateral surfaces serves as the light extraction surface 10*b*. In the illustrated example, the one or more lateral portions 13 include four outer lateral surfaces that constitute the rectangular outer shape of the cap 15. The one or more lateral portions 13 include: a first lateral portion 13-1 that has an outer lateral surface serving as the light extraction surface 10*b*; and a second lateral portion 13-2 that is located opposite to the first lateral portion 13-1 with the closed space V located therebetween. In the illustrated example, the light extraction surface 10*b* of the first lateral portion 13-1 and the outer lateral surface of the second lateral portion 13-2 are parallel to each other. The light extraction surface 10*b* is parallel to the XY plane shown in the drawings. At a side opposite to the light extraction surface 10*b*, which is an outer lateral surface, the first lateral portion 13-1 has an inner lateral surface serving as a light incident surface 10*a*. The first lateral portion 13-1 includes a light-transmitting portion 16 configured to transmit light and at least including a portion of the light incident surface 10*a* and a portion of the light extraction surface 10*b*.

The first lateral portion 13-1 and the second lateral portion 13-2 are spaced apart from each other via the closed space V, the third lateral portion 13-3, and the fourth lateral portion 13-4. In the illustrated example, the first lateral portion 13-1 is connected to a third lateral portion 13-3 and a fourth lateral portion 13-4 that extend along the Z direction. The second lateral portion 13-2 is connected to the third lateral portion 13-3 and the fourth lateral portion 13-4. The first lateral portion 13-1 does not include the outer lateral surface of the second lateral portion 13-2. The second lateral portion 13-2 does not include the outer lateral surface of the first lateral portion 13-1.

In the present specification, the expression that a region is "light-transmissive" means that the region has a transmittance of 80% or more with respect to a main portion of light entering the region. In the package 10 of the illustrated example, all of its four outer lateral surfaces are light-transmissive, and the outer lateral surface of the first lateral portion 13-1 among these four outer lateral surfaces serves as the light extraction surface 10*b*.

The second lateral portion 13-2 has an inner lateral surface 13-2*a* facing the light incident surface 10*a* of the first lateral portion 13-1. Each of the light incident surface 10*a* and the light extraction surface 10*b* may be perpendicular to the mounting surface 11M. As used herein, the term "perpendicular" allows for a deviation within ±5 degrees. However, each of the light incident surface 10*a* and the light extraction surface 10*b* may be tilted with respect to the mounting surface 11M.

The lower portion 11 may include one or more metal layers to be electrically connected to electronic parts or other components, such as light-emitting elements. In one example, the one or more metal layers are formed of an electrical conductor such as a metal, patterned, and disposed on the mounting surface 11M. The electronic parts may be electrically connected to the metal layer(s) on the mounting surface 11M via a metal wire(s), for example. The metal layer(s) on the mounting surface 11M may be electrically connected to one or more metal layers that are provided on a surface (e.g., a lower surface) at the opposite side from the mounting surface 11M by a via hole(s), for example. The package structure according to embodiments of the present disclosure is not limited to the illustrated example. The "package" in embodiments of the present disclosure may be any appropriate structure that includes a "lower portion" on which one or more components are to be disposed and "lateral portions" surrounding the one or more components.

Light-Emitting Element 20

An example of a light-emitting element 20 is a semiconductor laser element such as a vertical-cavity surface-emitting laser element (VCSEL element) or an edge-emitting laser element, or a light-emitting diode (LED). Hereinafter, vertical-cavity surface-emitting laser elements will be referred to as "VCSEL elements." The light-emitting elements 20 exemplified in FIG. 2 are VCSEL elements. Each light-emitting element 20 illustrated in FIG. 2 may have a rectangular outer shape in a top view. As compared to edge-emitting laser elements, VCSEL elements excel in that: a more circular beam shape is obtained; arranging a plurality of emitters in two-dimensional directions will relatively easily provide a two-dimensional array; and/or they can be driven with low power consumption. Each light-emitting element 20 has an upper surface 20*a*. One or more emission points (emitters) 20*e* are located on the upper surface 20*a*. The upper surface 20*a* functions as a light-exiting surface. Thus, the light-emitting element 20 may be a single-emitter (i.e., having one emitter), or a multi-emitter (i.e., having two or more emitters).

As each light-emitting element 20, for example, a semiconductor laser element emitting blue light, a semiconductor laser element emitting green light, a semiconductor laser element emitting red light, or the like may be employed. Semiconductor laser elements emitting any other color light, e.g., infrared light, may also be used.

In the description below, a case in which semiconductor laser elements such as VCSEL elements or edge-emitting laser elements are employed as the light-emitting elements 20 will be further illustrated. Laser light emitted from the semiconductor laser element exhibits divergence. Laser light exhibits a far field pattern (hereinafter referred to as "FFP") of a substantially circular shape or an elliptical shape at a plane that is parallel to the light-exiting surface. The FFP is the shape or optical intensity distribution of the emitted light at a position away from the light-exiting surface. Laser light that is emitted from a VCSEL element may have an FFP of a substantially circular shape, whereas laser light that is emitted from an edge-emitting laser element may have an FFP of an elliptical shape. In the present specification, a ray that passes through the center of the shape of an FFP of laser light will be referred to as an "optical axis of the laser light". Light traveling along the optical axis exhibits a peak intensity in the optical intensity distribution of the FFP. According to embodiments of the present disclosure, in the optical intensity distribution of an FFP, light having an intensity of $1/e^2$ or greater with respect to the peak intensity value will be referred to as the "main portion" of light, whereas light having an intensity less than $1/e^2$ with respect to the peak intensity value will be referred to as the "peripheral portion" of light, for distinction between the "main portion" of light and the "peripheral portion" of light. Meanwhile, the "main portion" of light and the "peripheral portion" of light may be distinguished based on a so-called "full width at half maximum," i.e., a beam diameter at which the intensity equals a half of the peak intensity value in the optical intensity distribution of the FFP.

Based on the optical intensity distribution of an FFP, an angle corresponding to $1/e^2$ of the optical intensity distribution is defined as an angle of divergence of the light from that semiconductor laser element. In the case where the light emitted from the semiconductor laser element has an FFP of a substantially circular shape, the angle of divergence in the direction along its diameter is 3 degrees or more, for example. On the other hand, in the case where the light emitted from the semiconductor laser element has an FFP of an elliptical shape, the minor axis direction of the ellipse will be referred to as the slow-axis direction, and its major axis direction will be referred to as the fast-axis direction. The angle of divergence along the slow-axis direction is smaller than the angle of divergence along the fast-axis direction. The angle of divergence of light emitted from each semiconductor laser element along the slow-axis direction is 3 degrees or more, for example.

Figure 4A:
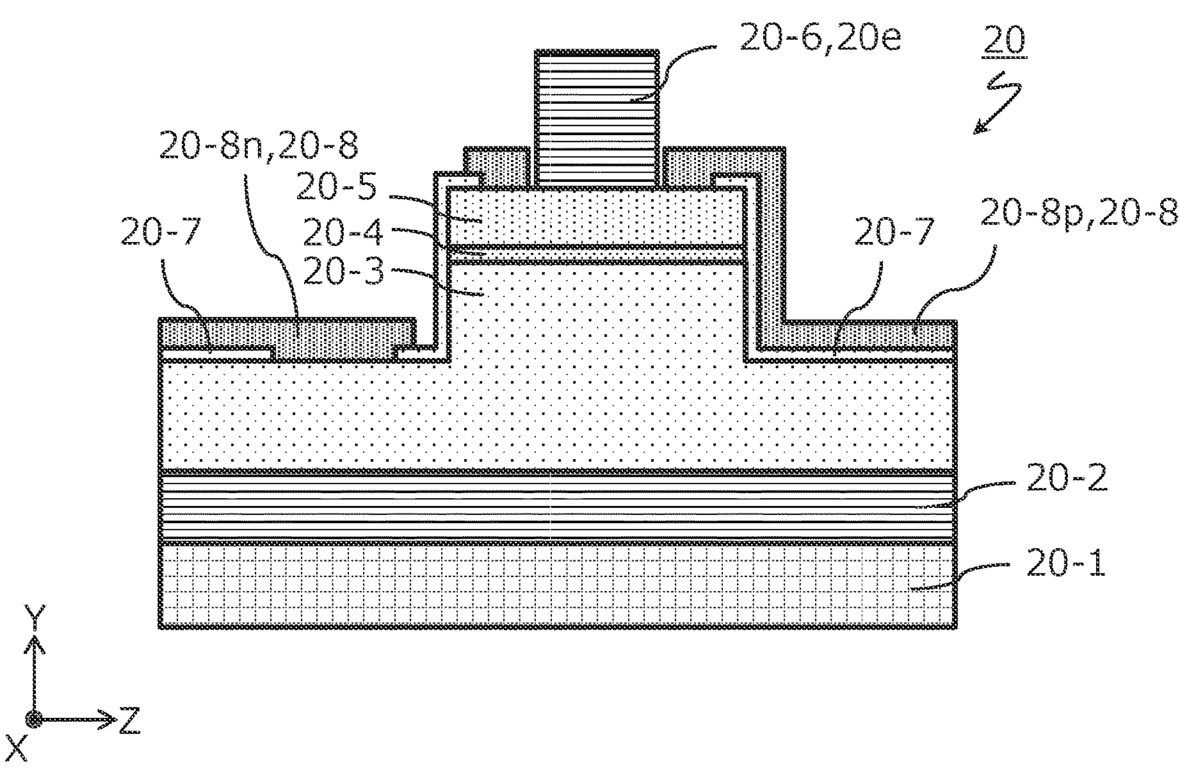
FIG. 4A is a cross-sectional view which is parallel to the YZ plane, schematically showing an example configuration of a vertical-cavity surface-emitting laser element.
Figure 4B:
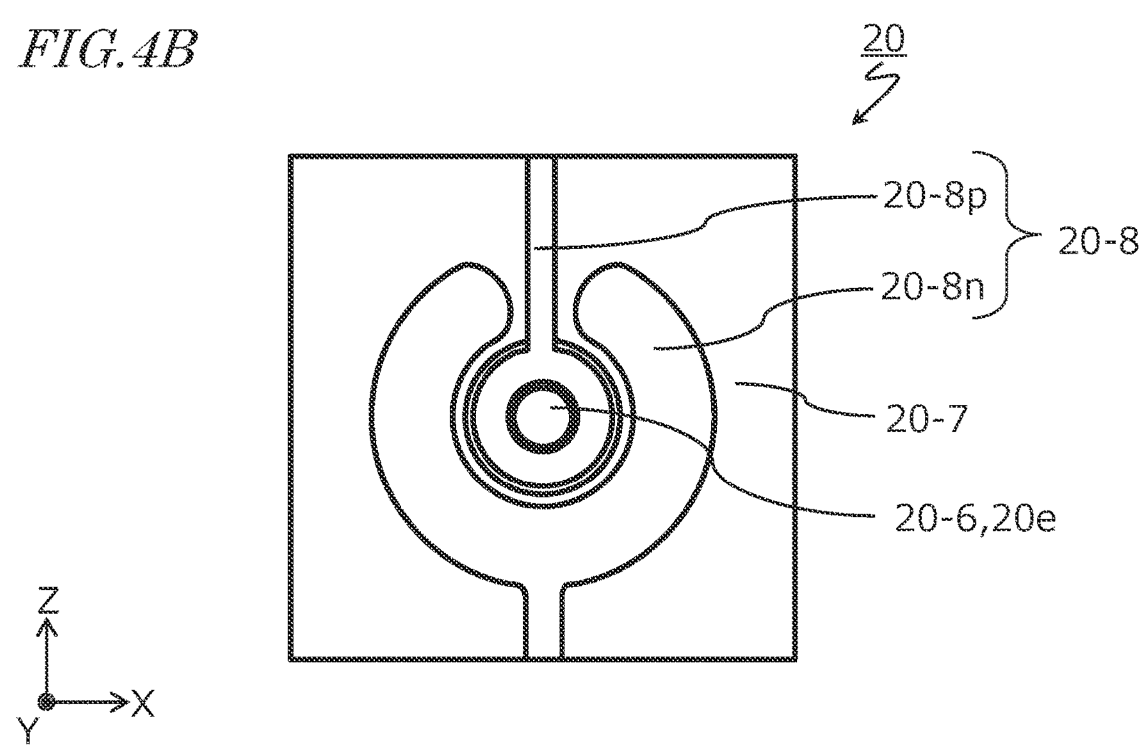
FIG. 4B is a top view of the configuration shown in FIG. 4A.

With reference to FIG. 4A and FIG. 4B, an example structure of a VCSEL element will be described. The example structures described below are mere examples, and the structure of a VCSEL element according to an embodiment of the present disclosure is not limited to the description below.

FIG. 4A is a schematic cross-sectional view that is parallel to the YZ plane, schematically showing an example configuration of a VCSEL element. FIG. 4B is a schematic top view of the configuration shown in FIG. 4A. The illustrated exemplary VCSEL element has a multilayer structure in which a semiconductor substrate 20-1, n-side reflection film 20-2, an n-type semiconductor layer 20-3, an active layer 20-4, a p-type semiconductor layer 20-5, and p-side reflection film 20-6 are layered in this order. The p and n conductivity types may be reversed. The semiconductor substrate 20-1 may have been removed.

The n-type semiconductor layer 20-3 includes a flat-plate portion and a protrusion that protrudes upward (i.e., in the Y direction) from the flat-plate portion. The active layer 20-4 is located on an upper surface of the protrusion of the n-type semiconductor layer 20-3, and the p-type semiconductor layer 20-5 is located on an upper surface of the active layer 20-4. The p-side reflection film 20-6 is disposed on a region of an upper surface of the p-type semiconductor layer 20-5 other than its peripheral region. The VCSEL element includes an insulating layer 20-7 that covers an upper surface of the flat-plate portion and lateral surfaces of the protrusion of the n-type semiconductor layer 20-3. However, a portion of the upper surface of the flat-plate portion of the n-type semiconductor layer 20-3 is exposed without being covered by the insulating layer 20-7. The VCSEL element includes: a p-side electrode 20-8$p$ that is electrically connected to the p-type semiconductor layer 20-5; and an n-side electrode 20-8$n$ that is electrically connected to an exposed portion of the n-type semiconductor layer 20-3. The n-side reflection film 20-2 and the p-side reflection film 20-6 may each be formed of a distributed Bragg reflector (DBR), for example.

As exemplified in FIG. 4B, in a top view, the p-side reflection film 20-6, the insulating layer 20-7, the p-side electrode 20-8$p$, and the n-side electrode 20-8$n$ are exposed. In a top view, the p-side electrode 20-8$p$ includes: an annular portion surrounding the p-side reflection film 20-6; and a linear portion extending in the Z direction from the annular portion. In a top view, the n-side electrode 20-8$n$ includes: a C-shaped portion surrounding the annular portion of the p-side electrode 20-8$p$ and the p-side reflection film 20-6; and a linear portion extending in the Z direction from the C-shaped portion. The p-side electrode 20-8$p$ and the n-side electrode 20-8$n$ constitute an electrode pair 20-8. Other than the illustrated example, in the multilayer structure, the n-side electrode 20-8$n$ may be provided at a side opposite to the p-side electrode 20-8$p$ with respect to the active layer 20-4.

By injecting a current into the active layer 20-4 from the p-side electrode 20-8$p$ and the n-side electrode 20-8$n$, a population inversion occurs in the active layer 20-4, whereby light amplification by stimulated emission, i.e., laser oscillation, occurs at a desired lasing wavelength. Light that is amplified through laser oscillation in the active layer 20-4 passes through the p-side reflection film 20-6, and is emitted upward. Therefore, an emission point 20$e$ of the VCSEL element is situated within the multilayer structure of the p-side reflection film 20-6 in a top view.

A semiconductor laser element emitting red light may be made of at least one selected from the group consisting of InAlGaP-based, GaInP-based, GaAs-based, and AlGaAs-based semiconductor materials, for example. In one example of such a semiconductor laser element, in the illustrated light-emitting element 20, the semiconductor substrate 20-1 may be made of an n-type GaAs, and the multilayer structure of the n-side reflection film 20-2 and the p-side reflection film 20-6 may respectively be made of n-type AlGaAs materials and p-type AlGaAs materials of different composition ratios. The n-type semiconductor layer 20-3 and the p-type semiconductor layer 20-5 may respectively be made of an n-type AlGaInP and a p-type AlGaInP, and the active layer 20-4 may be made of GaInP.

A semiconductor laser element emitting green or blue light may be made of at least one semiconductor material selected from the group consisting of GaN, InGaN, and AlGaN, for example. In one example of such a semiconductor laser element, in the illustrated light-emitting element 20, the semiconductor substrate 20-1 may be made of GaN. The multilayer structure of the n-side reflection film 20-2 may be made of AlInN and GaN, and the multilayer structure of the p-side reflection film 20-6 may be made of dielectric materials such as $SiO_2$ and $Nb_2O_5$. The n-type semiconductor layer 20-3 and the p-type semiconductor layer 20-5 may respectively be made of an n-type GaN and a p-type GaN, and the active layer 20-4 may be made of InGaN.

"Blue light" emitted from the light-emitting element 20 according to embodiments of the present disclosure refers to light having an emission peak wavelength in a range of 420 nm to 494 nm. "Green light" refers to light having an emission peak wavelength in a range of 495 nm to 570 nm. "Red light" refers to light having an emission peak wavelength in a range of 605 nm to 750 nm.

Reflecting Part 30

A reflecting part 30 according to the first embodiment may have a prismatic shape. The prismatic shape is a cylinder with a polygonal base. The reflecting part 30 has one or more reflection surfaces. In addition to the reflection surface(s), the reflecting part 30 may also have a surface to be bonded to other components. In the illustrated example of the light emitting device 100, the reflecting part 30 has a bonding surface 30$a$ bonded to other components. As a reflection surface, the reflecting part 30 has a first reflection surface 31 that is tilted with respect to the bonding surface 30$a$. The reflecting part 30 exemplified in FIG. 2 extends along the X direction, and has hexagonal end surfaces that extend in parallel to the YZ plane. The reflecting part 30 may have a shape other than a prismatic shape. An example of the main material of the reflecting part 30 is glass or silicon.

The first reflection surface 31 may be composed of a plane having a tilt angle of e.g. not less than 25 degrees and not more than 65 degrees with respect to the bonding surface 30$a$. More preferably, the range of tilt angles is not less than 40 degrees and not more than 50 degrees. In the illustrated example of the light emitting device 100, the first reflection surface 31 is composed of a flat surface that makes a tilt angle of 45 degrees with the bonding surface 30$a$. The phrase "45 degrees" as used herein encompasses variation within ±1 degree, exclusive. The first reflection surface 31 may be a partially-reflecting surface that transmits a portion of incident light and reflects another portion of incident light.

The first reflection surface 31 may be formed by providing on a light-transmissive material (e.g., glass) a light reflection control film that reflects incident light, for example. The light reflection control film may be made of a metal film such as Ag or Al, for example. Alternatively, the light reflection control film may be a multilayer dielectric film that is made of $Ta_2O_5/SiO_2$, $TiO_2/SiO_2$, $Nb_2O_5/SiO_2$, etc. For example, the reflectance or transmittance of the first reflection surface 31 can be controlled by changing the film thickness and/or the material of the light reflection control film.

In the case where the main material of the reflecting part 30 is glass, for example, a diffraction optical element may be provided on the first reflection surface 31 instead of a light reflection control film. An example of a diffraction optical element is a reflection-type diffraction grating. Alternatively, a DBR film may be provided on the first reflection surface 31.

Light Emitting Device 100

Next, the light emitting device 100 will be described.

The light emitting device 100 according to the first embodiment includes one or more light-emitting elements 20. In the illustrated example of the light emitting device 100, each light-emitting element 20 is a VCSEL element. In the illustrated example, there are three light-emitting elements 20. The three light-emitting elements 20 may respectively be referred to as a first light-emitting element, a second light-emitting element, and a third light-emitting element. The three light-emitting elements 20 is configured to emit respectively different colors of light selected from red light, green light, and blue light. The light-emitting element 20 may emit light other than visible light, e.g., infrared light. The plurality of light-emitting elements 20 are arranged on the first mounting region 11Ma of the mounting surface 11M. More specifically, the plurality of light-emitting elements 20 are arrayed along a direction parallel to the mounting surface 11M. The plurality of light-emitting elements 20 may be disposed on a plane that is parallel to the mounting surface 11M along a first direction, which is perpendicular to the optical axis of light from the plurality of light-emitting elements 20 after reflected at the first reflection surface 31 of the reflecting part 30. In the illustrated example, the first direction corresponds to the X direction are identical. The quantity of light-emitting elements 20 in the light emitting device 100 is not limited to three. Each light-emitting element 20 may be bonded to the first mounting region 11Ma via a metal adhesive containing Au particles or the like, a metal bump(s) containing a metal such as gold tin or solder, or a bonding member(s) made of a metal such as a solder alloy, for example.

The light emitting device 100 can include one or a plurality of reflecting part(s) 30. In the illustrated example, one reflecting part 30 is disposed above the three light-emitting elements 20. Alternatively, three reflecting parts 30 each corresponding to a respective one of the three light-emitting elements 20 may be provided above respective corresponding light-emitting elements 20. The reflecting part 30 may be bonded to the lower surface 14*b* of the upper portion 14 of the cap 15 and/or the mounting surface 11M at one or more bonding surfaces 30*a*. In the illustrated example of the light emitting device 100, the reflecting part 30 is disposed on the lower surface 14*b* of the upper portion 14 of the cap 15, and its bonding surface 30*a* is bonded to the lower surface 14*b*. The reflecting part 30 is a separate component that is a component separate from the cap 15. In this case, the reflecting part 30 may be made of silicon as a main material, for example. When being a component separate from the cap 15 (as in this example), the reflecting part 30 may be referred to as a "reflecting member."

The reflecting part 30 may be bonded to the upper portion 14 via a metal adhesive containing Au particles or the like, a metal bump(s) containing a metal such as gold tin or solder, or a bonding member(s) made of a metal such as a solder alloy, for example.

The light-emitting elements 20 and the reflecting part 30 are disposed within the closed space V of the package, and the first reflection surface 31 of the reflecting part 30 is located within the closed space V. The reflecting part 30 is disposed to cover the three light-emitting elements 20 from above. The first reflection surface 31 is tilted at an angle of e.g., 45 degrees with respect to the mounting surface 11M, and is located above the upper surfaces 20*a* of the light-emitting elements 20.

The one or more lateral portions 13 of the cap 15 include: a first lateral portion 13-1; and a second lateral portion 13-2 located on an opposite side from the first lateral portion 13-1 with respect to the light-emitting elements 20. The reflecting part 30 is disposed within the closed space V such that the first reflection surface 31 faces the light incident surface 10*a* of the first lateral portion 13-1. In the cross-sectional view depicted in FIG. 3, an upper end of the first reflection surface 31 is closer to the light incident surface 10*a* of the first lateral portion 13-1 than a lower end of the first reflection surface 31. In the illustrated example, the first reflection surface 31 is disposed in the closed space V to be spaced apart from the inner lateral surface 13-2*a* of the second lateral portion 13-2.

Light that is emitted upward (i.e., in the Y direction) from each light-emitting element 20 is reflected in a lateral direction (the Z direction) at the first reflection surface 31. The light-transmitting portion 16 of the first lateral portion 13-1 of the cap 15 is disposed at a position through which light reflected from the first reflection surface 31 passes. Light reflected from the first reflection surface 31 travels within the closed space V, then is incident on the light incident surface 10*a* of the light-transmitting portion 16, transmitted through the light-transmitting portion 16, and emitted outside of the package 10 through the light extraction surface 10*b*.

The first reflection surface 31 of the reflecting part 30 can serve as a boundary with the closed space V. In the illustrated example, the first reflection surface 31 of the reflecting part 30 is directly exposed to the closed space V that it defines, without being in contact with any other components.

Figure 5:
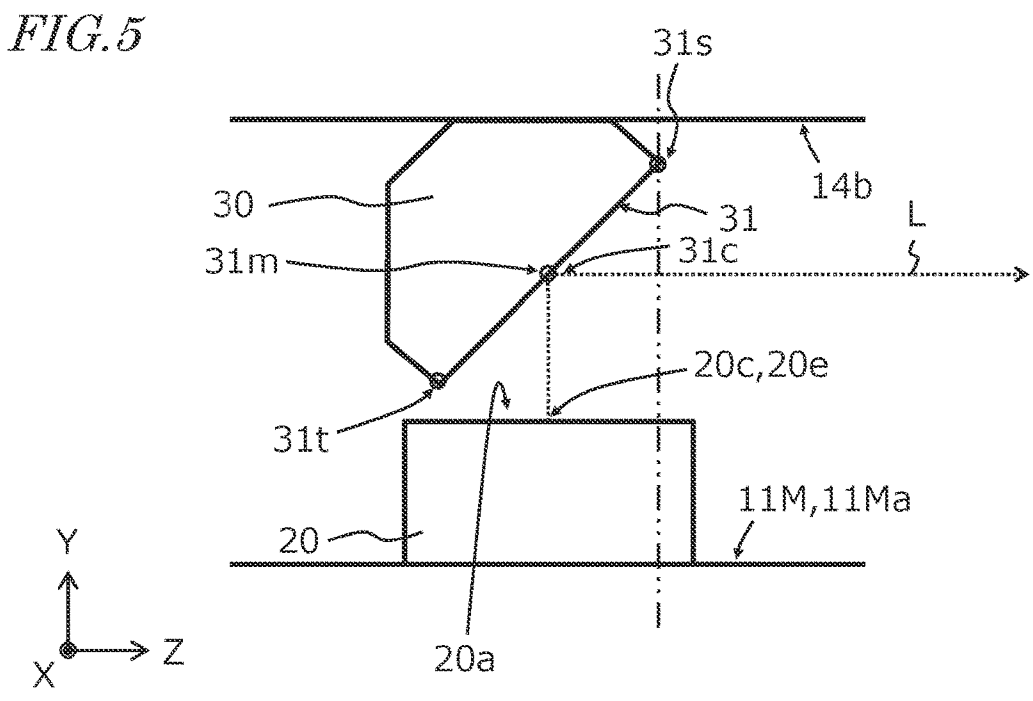
FIG. 5 is a schematic enlarged cross-sectional view, in which an intersection between the optical axis of light that is emitted from a light-emitting element and a first reflection surface and a vicinity of the intersection that are shown in the cross-sectional view of FIG. 3 are shown enlarged.

FIG. 5 is a schematic enlarged cross-sectional view in which an intersection 31*c* between the optical axis of light that is emitted from the light-emitting element 20 shown in FIG. 3 and the first reflection surface 31 and its neighborhood are shown enlarged. For ease of illustration, each component is shown without hatching. FIG. 5 illustrates a cross section that is parallel to the YZ plane through a center 20*c* of the upper surface 20*a* of the light-emitting element 20. The upper surface 20*a* of each light-emitting element 20 may have a rectangular shape, a circular shape, or another polygonal shape, for example. When the upper surface 20*a* has a rectangular shape, the term "center 20*c* of the upper surface 20*a*" refers to an intersection between two diagonals. When the shape of the upper surface 20*a* has a circular shape, the term "center 20*c* of the upper surface 20*a*" refers to the center of the circular shape. When the shape of the upper surface 20*a* has a polygonal shape, the term "center 20*c* of the upper surface 20*a*" refers to, for example, the center of an incircle of the polygonal shape. In the present specification, in the cross-sectional view shown in FIG. 5, a midpoint of a line segment extending between a highest point 31*s* located at an upper end of the first reflection surface 31 and a lowest point 31*t* located at a lower end of the first reflection surface 31 is referred to as a "midpoint 31*m* of the first reflection surface 31." In the cross-sectional view shown in FIG. 5, the highest point 31*s*, the lowest point 31*t*, and the midpoint 31*m* are encircled by open circles.

The light-emitting element 20 in the light emitting device 100 exemplified in FIG. 5 has a single emission point 20*e*, and the upper surface 20*a* has a rectangular shape (see also FIG. 2). The emission point 20*e* is located at the center 20*c* of the upper surface 20*a*, for example. In the direction normal to the mounting surface 11M, a distance between the mounting surface 11M and the lower surface 14*b* of the upper portion 14 is greater than a distance between the mounting surface 11M and the midpoint 31*m* of the first reflection surface 31. In FIG. 5, a first distance, which is defined as a distance between the mounting surface 11M and the lower surface 14*b*, is greater than a second distance, which is defined as a distance between the upper surface 20*a* of a light-emitting element 20 and the midpoint 31*m* of the first reflection surface 31. The first distance may be equal to or greater than 1.5 times the second distance, for example. The distance between the midpoint 31*m* of the first reflection surface 31 and the intersection 31*c* between the optical axis L of light that is emitted from the emission point 20*e* on the upper surface 20*a* of the light-emitting element 20 and the first reflection surface 31 is e.g. 30 μm or less. With such distances, the reflecting part 30 can be reduced in size. In the illustrated example, the reflecting part 30 is disposed so that the midpoint 31*m* of the first reflection surface 31 coincides with the emission point 20*e* of the light-emitting element 20 in a top view. In this case, the intersection 31*c* and the midpoint 31*m* on the first reflection surface 31 coincide with each other.

The light-emitting element 20 may have a plurality of emission points (thus being a so-called multi-emitter). In this case, the midpoint 31*m* of the first reflection surface 31 coincides with the intersection 31*c* between the optical axis L of light that is emitted from one of the plurality of emission points 20*e* and the first reflection surface 31. The intersection 31*c* between the first reflection surface 31 and the optical axis L of light emitted from an emission point 20*e* that is located at the center 20*c* of the upper surface 20*a* of the light-emitting element 20 or an emission point 20*e* that is the closest to the center 20*c* is referred to as the "first point." Preferably, the midpoint 31*m* of the first reflection surface 31 coincides with the first point. With such an arrangement of the light-emitting element 20 and the first reflection surface 31, light emitted from the plurality of emission points 20*e* can be efficiently reflected from the first reflection surface 31. For example, all of the main portions of light emitted from the light-emitting element 20 can be reflected. This also allows the first reflection surface 31 and the reflecting part 30 to be reduced in size. According to the first embodiment, the distance between the emission point 20*e* and the midpoint 31*m* of the first reflection surface 31 can be reduced to about 10 for example.

In the present specification, a direction in which light having been reflected from the first reflection surface 31 travels is referred to as the "direction of light travel." When two or more configurations or components are to be compared, one of them that is located farther in the direction of light travel than the other will be expressed as being located at a "light-travel side." The "direction of light travel" can be a direction perpendicular to the light incident surface 10*a*. The aforementioned first direction and the "direction of light travel" are both perpendicular to the light incident surface 10*a*. In the illustrated example, the "direction of light travel" is parallel to the Z direction. The lateral surface that is located closest to the light-travel side among the lateral surfaces of the light-emitting element 20 is located closer to the light travel side relative to the highest point 31*s* of the first reflection surface 31. In the light-emitting element 20 of the illustrated example, the entirety of this lateral surface that is located closest to the light-travel side is located closer to the light-travel side relative to the highest point 31*s* of the first reflection surface 31. FIG. 5 illustrates a chain double-dashed line that passes through the highest point 31*s* of the first reflection surface 31 and which is parallel to the Y direction.

The light-emitting element 20 and the reflecting part 30 can be disposed so that, in the direction normal to the mounting surface 11M, i.e., the Y direction, the distance between the lowest point 31*t* of the first reflection surface 31 and the upper surface 20*a* of each light-emitting element 20 is 20 μm or less. With such an arrangement, the upper surface 20*a* of each light-emitting element 20 can be located closer to the first reflection surface 31, thus allowing for reduction in size along the height direction of the light emitting device 100, i.e., the Y direction. In the illustrated example, the upper surface 20*a* of each light-emitting element 20 is located below the lowest point 31*t* of the first reflection surface 31. The light-emitting element 20 and the reflecting part 30 may be disposed so that the lowest point 31*t* is located at the same height as the upper surface 20*a* or below the upper surface 20*a*. Moreover, in the direction normal to the mounting surface 11M, the distance from the emission point 20*e* of the light-emitting element 20 to the intersection 31*c* between the first reflection surface 31 and the optical axis of light that is emitted from the emission point 20*e* can be 30 μm or greater and 800 μm or less. With the upper surface 20*a* of each light-emitting element 20 located closer to the first reflection surface 31, the light emitting device 100 can be reduced in size.

When the closed space V is trisected at planes that are parallel to the mounting surface 11M (the XZ plane) so as to be equally divided along the direction normal to the mounting surface 11M (the Y direction), and the obtained three spaces are referred as a first space, a second space, and a third space in descending order of height along the Y direction, the highest point 31*s* of the first reflection surface 31 is located in the first space, and the intersection 31*c* ("first point") is located in the second space. When the closed space V is bisected at a plane that is parallel to the mounting surface 11M (the XZ plane) so as to be equally divided along the direction normal to the mounting surface 11M (the Y direction), and the obtained spaces are referred to as a fourth space and a fifth space in descending order of height along the Y direction, the lowest point 31*t* of the first reflection surface 31 is located in the fifth space.

In the direction normal to the mounting surface 11M, i.e., the Y direction, the length between the mounting surface 11M and the lower surface 14*b* of the upper portion 14 is preferably 2 to 20 times the length of the light-emitting element. When the length is 2 times or greater, respective components can be easily disposed so that the reflecting part 30 and the light-emitting element 20 overlap each other in a top view. When the length is 20 times or smaller, the entirety of the light emitting device 100 can be reduced in height.

Light emitted upward from the light-emitting element 20 is reflected from the first reflection surface 31 to travel in a lateral direction, transmitted through the light-transmitting portion 16 of the cap 15, and emitted outside. In the case in which the light-emitting element 20 is a semiconductor laser element such as a VCSEL element, as described earlier, the laser light emitted from the light-emitting element 20 is divergent light having an angle of divergence. As the laser light travels farther, its FFP increases in size. Therefore, the shorter the distance (second distance) from the upper surface 20*a* of each light-emitting element 20 to the midpoint 31*m* of the first reflection surface 31 is, the smaller the size of the irradiated region on the first reflection surface 31 to be irradiated with the light emitted from the light-emitting element 20 can be. For example, when the distance between the midpoint 31*m* of the first reflection surface 31 and the emission point 20*e* of the light-emitting element 20 along the Y direction is about 10 μm, the size of the irradiated region can be reduced, e.g., to have a diameter of about 5 μm, for example. Thus, with the first reflection surface 31 having a small area, all of the main portions of light emitted from the light-emitting element 20 can be reflected. This allows for reduction in size of the reflecting part 30, and reduction in size of the entire light emitting device 100.

When the light-emitting element 20 includes a plurality of emission points 20*e*, placing the plurality of emission points 20*e* closer to the first reflection surface 31 allows the entire irradiated region on the first reflection surface 31 to be reduced in size. This can greatly contribute to reduction in size of the light emitting device.

Modified Example of the First Embodiment

Figure 6:
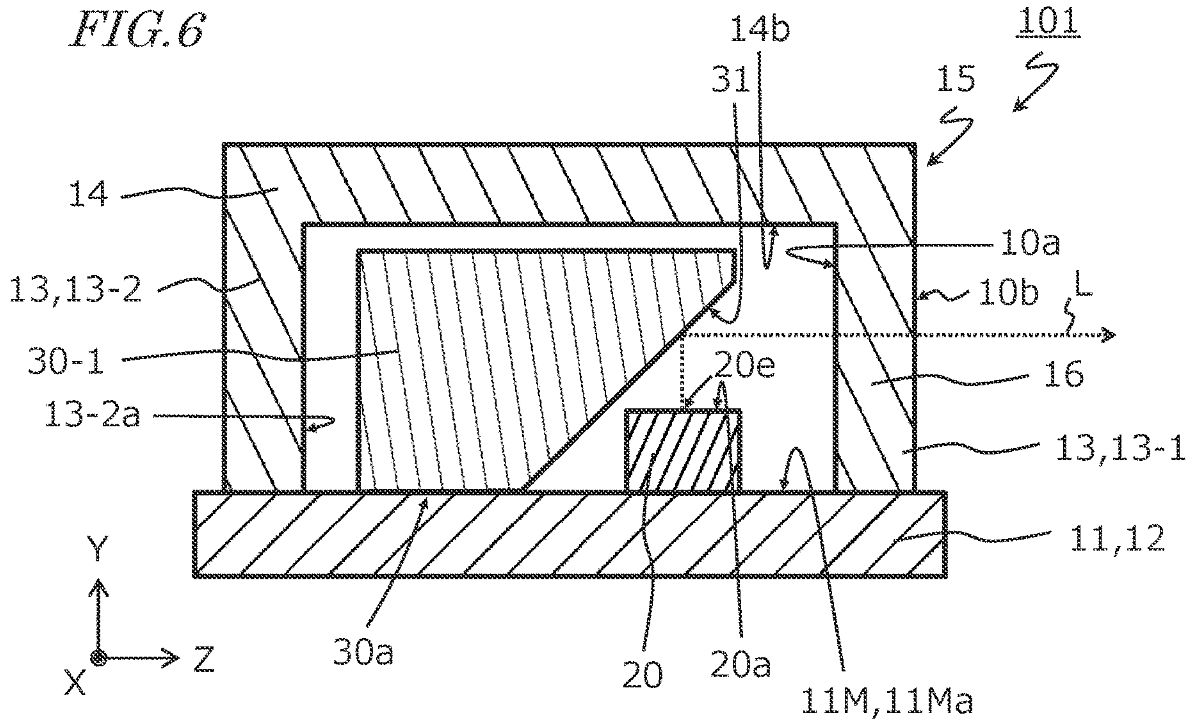
FIG. 6 is a schematic cross-sectional view of a light emitting device according to a modified example of the first embodiment of the present disclosure along a cross-sectional line VI-VI in FIG. 1.
Figure 7:
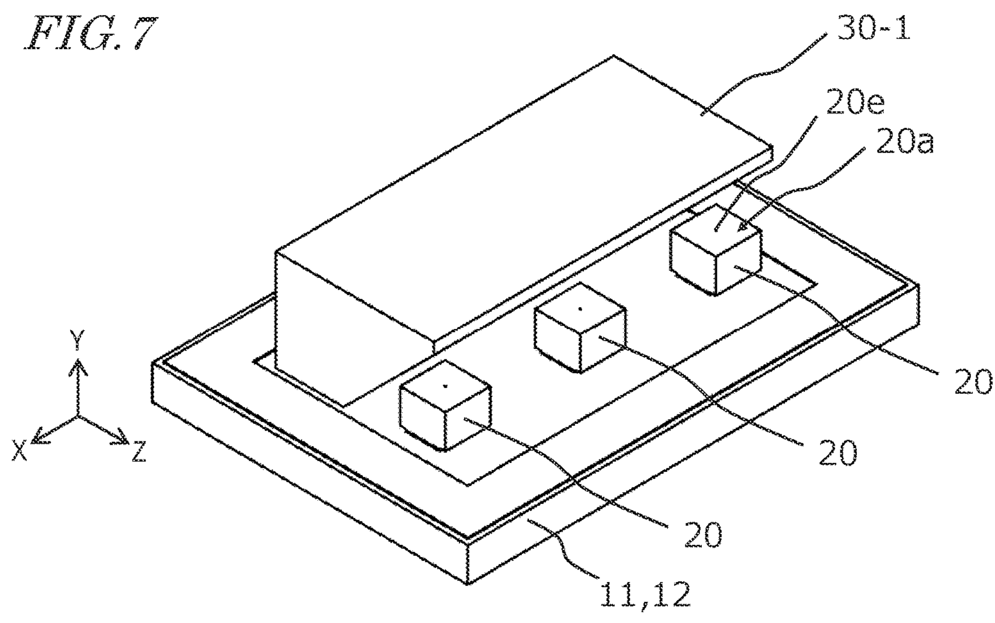
FIG. 7 is a schematic perspective view of the light emitting device shown in FIG. 6, from which a cap is omitted.

Next, with reference to FIG. 6 and FIG. 7, a modified example of the light emitting device according to the first embodiment will be described. In a light emitting device 101 according to the modified example, a reflecting part 30-1 is bonded to the mounting surface 11M of the lower portion 11. FIG. 1 shows a schematic perspective view of the light emitting device 101. FIG. 6 is a schematic cross-sectional view of the light emitting device 101 including the reflecting part 30-1. The cross section of the light emitting device 101 shown in FIG. 6 corresponds to a cross section along a cross-sectional line VI-VI in FIG. 1. FIG. 7 is a schematic perspective view of the light emitting device 101, from which the cap 15 is omitted.

The light emitting device 101 exemplified in FIG. 6 includes the reflecting part 30-1, which is bonded to the mounting surface 11M of the lower portion 11. In this example, the lower surface of the reflecting part 30-1 functions as the bonding surface 30*a*. The reflecting part 30-1 is made of e.g., glass as a main material, and a light reflection control film, a diffraction optical element, or a DBR film may be provided on the first reflection surface 31.

The bonding surface 30*a* of the reflecting part 30-1 is bonded to the mounting surface 11M, and the reflecting part 30-1 is disposed in the first mounting region 11Ma of the mounting surface 11M. As in the light emitting device 100 according to the first embodiment, the upper surface 20*a* of each light-emitting element 20 can be located closer to the first reflection surface 31, so that the reflecting part 30-1 in the light emitting device 101 can also contribute to reduction in size of the reflecting part. Further, the reflecting part 30-1 is mounted on the mounting surface 11M, on which the light-emitting element(s) 20 are also mounted, which may facilitate alignment of the mounting position.

In the illustrated example, one reflecting part 30-1 is disposed above the plurality of light-emitting elements 20. Alternatively, a plurality of reflecting parts 30-1, each corresponding to a respective one of the plurality of light-emitting elements 20, may be disposed above respective corresponding light-emitting elements 20. On the mounting surface 11M, the light-emitting element 20 is located at the light-travel side relative to the bonding surface 30*a* of the reflecting part 30-1. The area of the bonding surface 30*a* is greater than the area in which the light-emitting elements 20 are in contact with the mounting surface 11M.

Second Embodiment

With reference to FIG. 8 to FIG. 15, an example configuration of a light emitting device according to a second embodiment of the present disclosure will be described. The light emitting device 200 according to the second embodiment differs from the light emitting device 100 according to the first embodiment in including one or more light-receiving elements 40, a submount 50 on which light-emitting elements 20 are disposed, lens members 60, and a beam combiner 70. The light emitting device 200 does not need to include all of the light-receiving element(s) 40, the submount 50, the lens members 60, and the beam combiner 70. For example, the light emitting device 200 may have a configuration including the components as in the first embodiment and only the light-receiving elements 40, or a configuration including the components as in the first embodiment and only the lens members 60. The light-receiving elements 40 may be used to measure the intensity of light for monitoring purposes, for example. The lens members 60 may be used to collimate the light that is emitted from the light-emitting elements 20, for example. The illustrated light emitting device 200 includes as many light-receiving elements 40, lens members 60, and optic elements 71 included in the beam combiner 70 as the quantity of light-emitting elements 20. The quantity of these components is not necessarily equal to the quantity of light-emitting elements 20.

Figure 8:
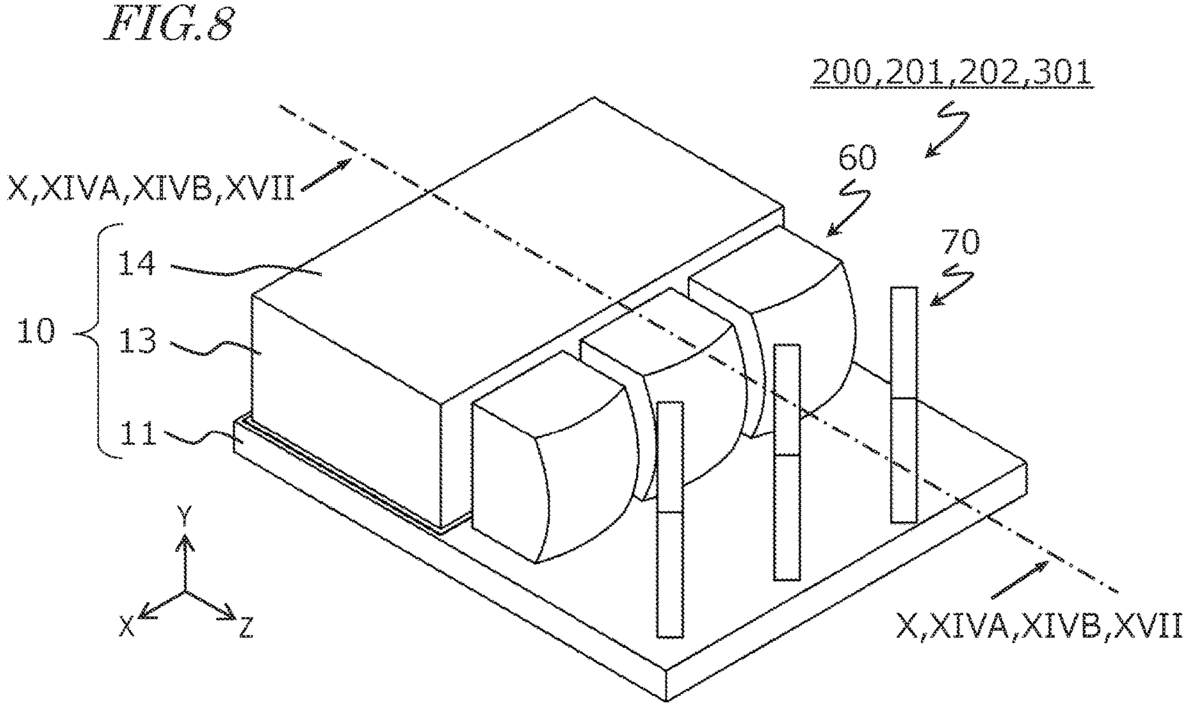
FIG. 8 is a schematic perspective view of a light emitting device according to second and third embodiments of the present disclosure.
Figure 9:
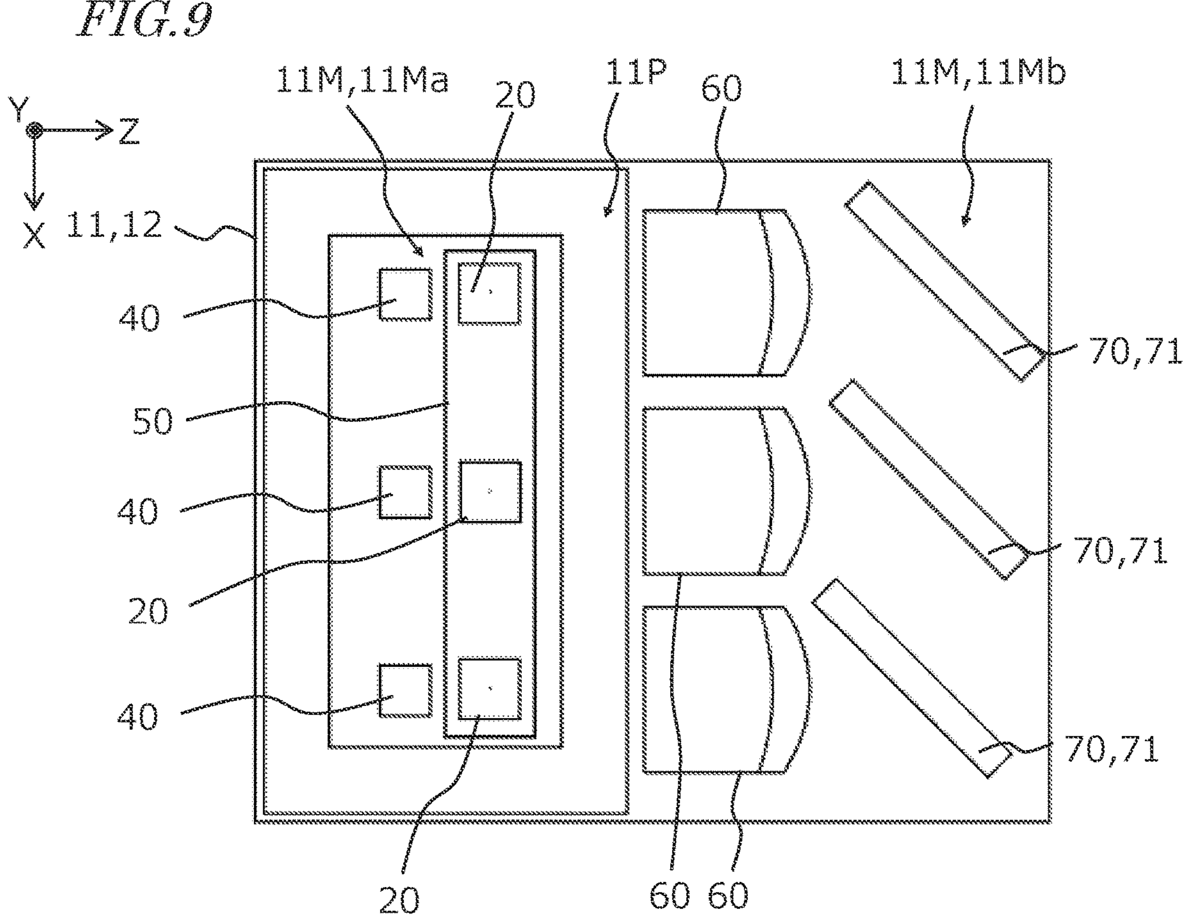
FIG. 9 is a schematic top view of the light emitting device according to the second embodiment of the present disclosure, from which a cap and a reflecting part are omitted.
Figure 10:
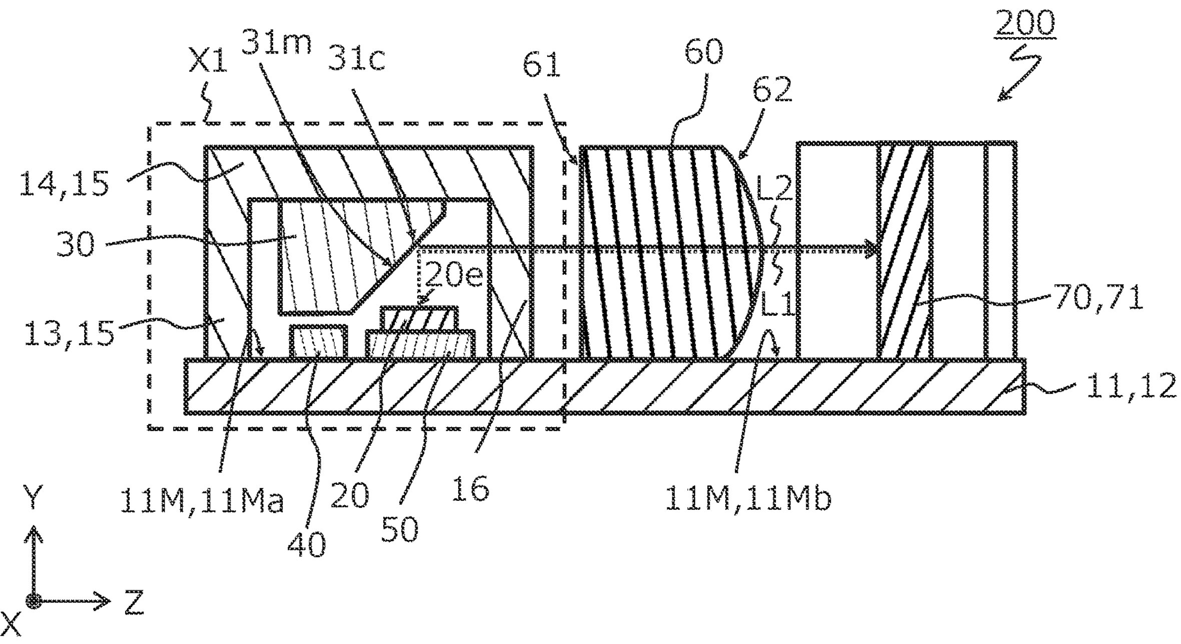
FIG. 10 is a schematic cross-sectional view of the light emitting device along a cross-sectional line X-X in FIG. 8.
Figure 11A:
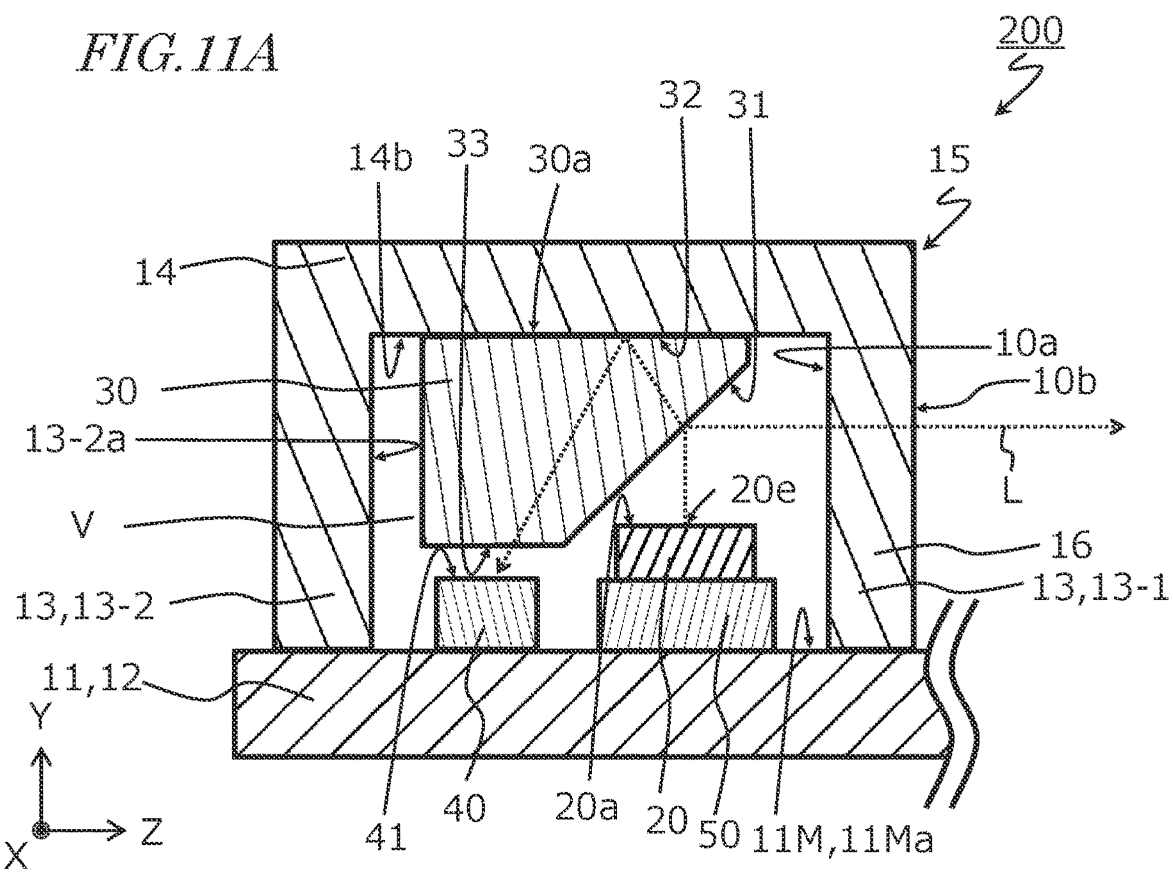
FIG. 11A is a schematic enlarged cross-sectional view of the light emitting device shown in FIG. 10, showing enlarged a portion surrounded by a broken line.
Figure 11B:
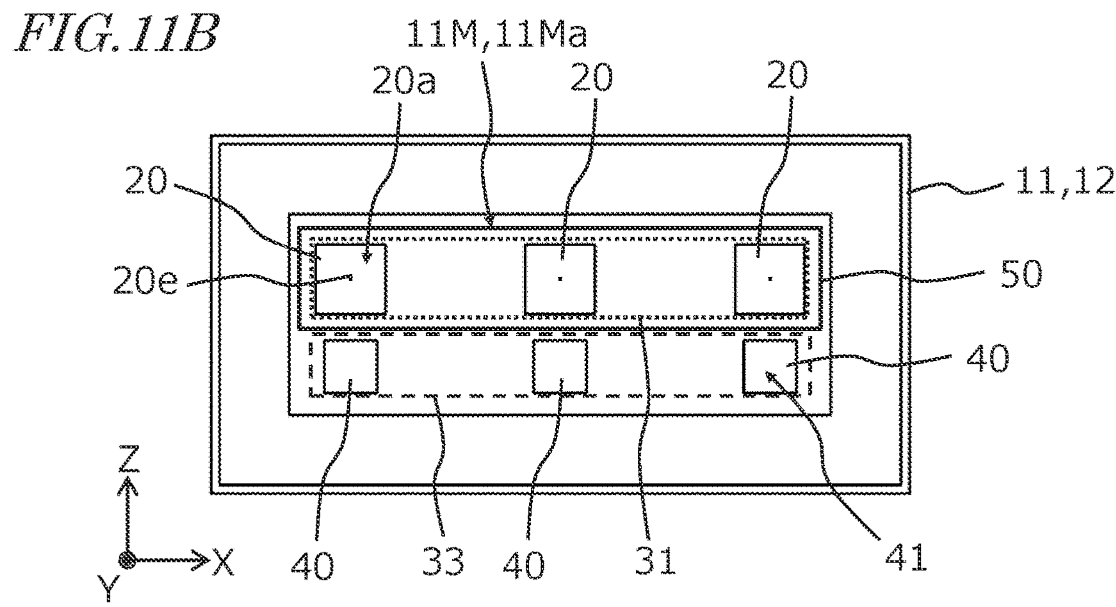
FIG. 11B is a schematic enlarged top view showing enlarged the portion of the light emitting device in FIG. 10 that is surrounded by a broken line, from which a cap and a reflecting part are omitted.
Figure 12:
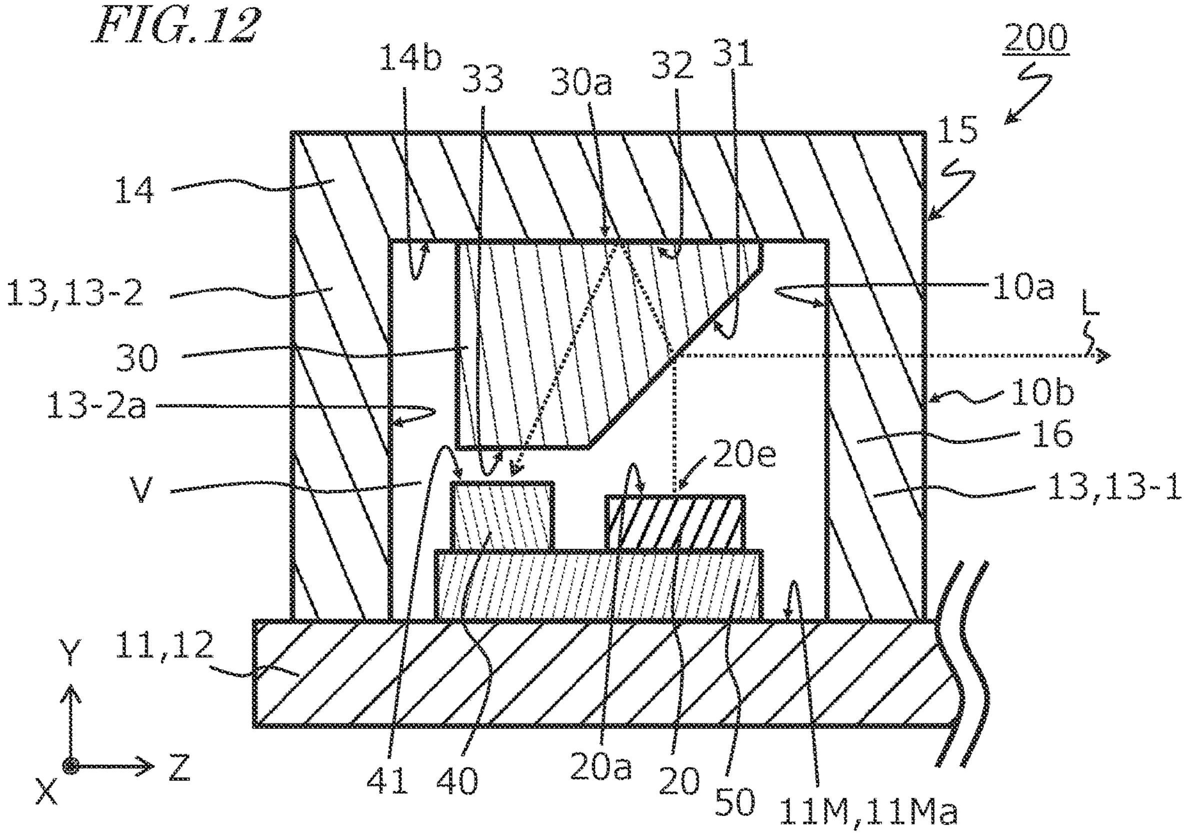
FIG. 12 is a schematic enlarged cross-sectional view showing another example structure of a light emitting device according to the second embodiment of the present disclosure.

With reference to FIG. 8 to FIG. 12, an example configuration of the light emitting device 200 including the light-receiving elements 40 and the lens members 60 will be described. FIG. 8 is a schematic perspective view of the light emitting device 200. FIG. 9 is a schematic top view of the light emitting device 200, from which a cap 15 and a reflecting part 30 are omitted. FIG. 10 is a schematic cross-sectional view of the light emitting device 200 along a cross-sectional line X-X in FIG. 8. FIG. 11A is an enlarged schematic cross-sectional view of the light emitting device 200, showing enlarged a portion X1 in a broken-line box in the cross-sectional view of FIG. 10. FIG. 11B is a schematic enlarged top view of the portion X1 of the light emitting device 200 in a broken-line box in FIG. 10, from which the cap 15 and the reflecting part 30 are omitted. In FIG. 11B, for illustration of a first reflection surface 31 and a lower surface 33 of the reflecting part 30 that will be described later, the first reflection surface 31 is indicated by a dotted line, and the lower surface 33 is indicated by a broken line. FIG. 12 is a partially-enlarged cross-sectional view schematically showing another example configuration for the light emitting device 200 including the submount 50. The partially enlarged view of FIG. 12 shows enlarged the portion X1 surrounded by the broken-line box in FIG. 10.

First, the respective components will be described. Description of those components that also appear in the first embodiment will be omitted.

Lower Portion 11, Substrate 12

The light emitting device 200 includes a lower portion 11 having a mounting surface 11M, which includes a first mounting region 11Ma and a second mounting region 11Mb. A peripheral region 11P is located between the first mounting region 11Ma and the second mounting region 11Mb. In the illustrated example, the substrate 12 serves as the lower portion 11.

Light-Receiving Element 40

Each light-receiving element 40 has a light-receiving surface 41 in its upper surface. An example of a light-receiving element 40 is a photoelectric conversion element (photodiode) that outputs an electrical signal in accordance with the intensity of amount of incident light. While the outer shape of the light-receiving element 40 illustrated in FIG. 9 and FIG. 11B is a rectangular solid, the light-receiving element 40 may have other outer shape. While the light-receiving surface 41 has a rectangular shape in these drawings, the light-receiving surface 41 may have other shape.

Submount 50

The illustrated example of the submount 50 has the shape of a rectangular solid, with an upper surface and a lower surface at an opposite side from the upper surface. However, the shape of the submount 50 is not limited to a rectangular solid. The upper surface and the lower surface of the submount 50 may serve as two bonding surfaces. The submount 50 can be made of silicon nitride, aluminum nitride, or silicon carbide, for example. On the lower surface of the submount 50, a metal film for bonding purposes may be provided. Meanwhile, on the upper surface of the submount 50, a plurality of wiring regions to be electrically connected to other components may be provided.

Lens Member 60

Each lens member 60 collimates incident light. Instead of collimating incident light, each lens member 60 may converge incident light, for example. Each lens member 60 has an incident surface 61 and an exiting surface 62. Each of the incident surface 61 and the exiting surface 62 may have a spherical or aspherical lens shape. Each lens member 60 may be made of a light-transmissive material, e.g., a glass, a plastic, or a resin.

Beam Combiner 70

The beam combiner 70 causes the incident lights from the plurality of light-emitting elements 20 to become coaxial, and thus emits combined light. The beam combiner 70 may have a structure in which a plurality of optic elements 71 are bonded together. Each optic element 71 may be formed of a transmissive material, for example, glass or plastic, that transmits visible light. The optic element 71 may be implemented by a dichroic mirror, for example. A dichroic mirror may include a multilayer dielectric film having a predetermined wavelength selectivity. A multilayer dielectric film may be formed of $Ta_2O_5/SiO_2$, $TiO_2/SiO_2$, $Nb_2O_5/SiO_2$, or the like.

Light Emitting Device 200

Next, the light emitting device 200 will be described.

In addition to the components of the light emitting device 100 according to the first embodiment, the light emitting device 200 according to the second embodiment may further include one or more light-receiving elements 40, a submount 50, one or more lens members 60, and a beam combiner 70.

The plurality of light-emitting elements 20 are disposed on one or more submounts 50. In the illustrated example, the plurality of light-emitting elements 20 are disposed on the upper surface of a single submount 50. The submount 50 is bonded to the first mounting region 11Ma of the mounting surface 11M of the lower portion 11. Each of the plurality of light-emitting elements 20 may be disposed on a corresponding one of a plurality of submounts 50. With the light-emitting elements 20 disposed on the upper surface of the submount(s) 50, heat from the light-emitting element 20 can be efficiently released through the submount (s) 50.

The one or more light-receiving elements 40 are disposed on the mounting surface 11M. The one or more light-receiving elements 40 are disposed on the first mounting region 11Ma, in which the one or more light-emitting elements 20 are disposed. The light-emitting element(s) 20 to emit light and the light-receiving element(s) 40 to receive the emitted light may be arrayed along the aforementioned direction of light travel, for example. In the illustrated example, the direction of light travel is parallel to the Z direction.

Correspondingly to the plurality of light-emitting elements 20, a plurality of light-receiving elements 40 to receive the exiting light from the respective light-emitting elements 20 may be disposed on the first mounting region 11Ma. The plurality of light-receiving elements 40 may be arrayed along a direction parallel to the aforementioned first direction. In the illustrated example, three light-receiving elements 40 corresponding to three light-emitting elements 20 arrayed along the X direction on the first mounting region 11Ma of the mounting surface 11M. The one or more light-emitting elements 20 are located at the light-travel side relative to the light-receiving elements 40 to receive the exiting light. In the illustrated example, in the Z direction, the three light-emitting elements 20 are closer to the light incident surface 10*a* than the light-receiving elements 40, which are configured to receive their respective exiting light, are to the light incident surface 10*a*. Thus, the light-emitting elements 20 are disposed close to the light incident surface 10*a*. This allows the optical path length from the emission point 20*e* of each light-emitting element 20 to the light incident surface 10*a* to be relatively short.

As in the example shown in FIG. 12, the light-receiving elements 40 may be disposed on the upper surface of the submount 50, on which the light-emitting elements 20 are disposed. Such an arrangement allows the light-emitting elements 20 and the light-receiving elements 40 to be disposed close to each other. This allows for reduction in size of the entire light emitting device 200 along the direction of light travel.

The first reflection surface 31 of the light emitting device 200 illustrated in FIG. 11A is a partially-reflecting surface that transmits a portion of incident light and reflects the remainder. On the bonding surface 30*a* of the reflecting part 30, a metal film of Ag, Al, or the like may be formed as a bonding layer, for example. The bonding surface 30*a* of the reflecting part 30 is bonded to the lower surface 14*b* of the upper portion 14 via the bonding layer. A whole or a part of the interface between this bonding layer and the bonding surface 30*a* functions as a reflection surface. Hereinafter, this reflection surface will be referred to as the "second reflection surface 32," as distinguished from the first reflection surface 31.

The reflecting part 30 of the light emitting device 200 further includes a second reflection surface 32 that reflects light that is emitted from each light-emitting element 20 and transmitted through the first reflection surface 31. The reflecting part 30 also includes the lower surface 33, which is located at an opposite side from the second reflection surface 32 and that is connected to the first reflection surface 31. A portion of the light emitted from each light-emitting element 20 is reflected from the first reflection surface 31 to be incident on the light-transmitting portion 16, another portion of the emitted light is transmitted through the first reflection surface 31 and reflected from the second reflection surface 32 to be incident on the light-receiving surface 41 of the light-receiving element 40.

In a top view, the first reflection surface 31 may overlap the entire upper surface 20*a* of each light-emitting element 20, whereas the second reflection surface 32 may overlap at least a portion of the light-receiving surface 41 of each light-receiving element 40. With the first reflection surface 31 overlapping the entire upper surface 20*a* of each light-emitting element 20, light emitted from the light-emitting element 20 can be efficiently reflected at the first reflection surface 31. In the example shown in FIG. 11B, the first reflection surface 31 overlaps the entirety of the three upper surfaces 20*a* of the three light-emitting elements 20. Moreover, the lower surface 33 of the reflecting part 30 and the light-emitting elements 20 are disposed so as not to overlap each other in a top view. Such an arrangement allows the distance between each light-emitting element 20 and the first reflection surface 31 to be reduced. The lower surface 33 overlaps at least a portion or the whole of the light-receiving surface 41 of each light-receiving element 40. The area of the region in which the light-receiving surface 41 of each light-receiving element and the lower surface 33 overlap may be equal to or greater than ½ of the area of the entire light-receiving surface 41, for example. In the illustrated example, the lower surface 33 overlaps the entire light-receiving surface 41 of each light-receiving element 40.

In the direction normal to the mounting surface 11M, the lower surface 33 is located above the light-receiving surface 41. The lower surface 33 is not directly in contact with the upper surface of each light-receiving element 40. In the illustrated example, in the direction normal to the mounting surface 11M, the lower surface 33 is located between the light-receiving surface 41 of each light-receiving element 40 and the upper surface 20*a* of each light-emitting element 20. By disposing the reflecting part 30 so that its lower surface 33 is thus located, the upper surface 20*a* of each light-emitting element 20 and the first reflection surface 31 can be placed close to each other. This allows for reduction in size of the entire light emitting device 200 along the height direction.

Each light-emitting element 20 and light-receiving element 40 can be disposed so that, regarding the direction of light travel, the distance between the light-emitting element 20 and the light-receiving element 40 is shorter than the length of the entire light-emitting element 20, for example. The direction of light travel is perpendicular to the light incident surface 10*a*, for example. For instance, the interval between the light-receiving element 40 and the light-emitting element 20 may be 20 μm or less. Such an arrangement allows for reduction in size of the reflecting part 30 being located above the light-emitting elements 20 and the light-receiving elements 40. This may contribute to reduction in size of the entire light emitting device 200.

The light emitting device 200 according to the second embodiment further includes one or more lens members 60 on which light emitted from the one or more light-emitting elements 20 is incident. The illustrated example of the light emitting device 200 includes three lens members 60 corresponding to three light-emitting elements 20. The light emitting device 200 further includes a beam combiner 70 having three optical elements 71 corresponding to three lens members 60. The number of lens members 60 and the number of optical elements 71 are not limited to this.

The one or more lens members 60 are disposed on the mounting surface 11M of the lower portion 11. In the direction normal to the mounting surface 11M, the one or more lens members 60 are disposed on the same plane as the mounting surface 11M, on which the one or more light-emitting elements 20 are disposed. More specifically, the one or more lens members are disposed in the second mounting region 11Mb of the mounting surface 11M. In the illustrated example, the three lens members 60 and the beam combiner 70 are disposed in the second mounting region 11Mb, which is located outside of the cap 15. In the light emitting device 200, the three light-emitting elements 20 and the reflecting part 30 are located inside the cap 15, whereas the three lens members 60 and the beam combiner 70 are located outside of the cap 15.

Each lens member 60 is positioned so that its incident surface 61 faces toward the first reflection surface 31 of the reflecting part 30 and the light extraction surface 10*b* of the cap 15, thus to receive light that is emitted from the light extraction surface 10*b*. Although FIG. 8 illustrates the three lens members 60 as separate components, this is not a limitation; a structure in which three lens members 60 are monolithically formed may be employed.

In the illustrated example of the light emitting device 200, in the direction normal to the mounting surface 11M, the lens optical axis L2 of the lens member 60 passes through an intersection 31*c* between the first reflection surface 31 and the optical axis L1 of light that is emitted from the emission point 20*e* of each light-emitting element 20. Preferably, the lens optical axis L2 of each lens member 60 passes through a "first point," which is an intersection with the optical axis L of light that is emitted from an emission point 20*e* that is located at the center of the light-emitting element 20, or an emission point 20*e* that is the closes to the center. In the illustrated example, the intersection 31*c* being the first point is located above a midpoint 31*m* of the first reflection surface 31. With the lens members 60 having the lens optical axis L2 at such a height, a main portion of the light reflected from the first reflection surface 31 can be efficiently introduced onto the incident surface 61 of the lens member 60. In the Y direction, the distance between the intersection 31*c* being the first point and the midpoint 31*m* of the first reflection surface 31 may be e.g. 100 μm or less. Such a distance allows for reducing the need for increasing the size of the lens member 60 along the height direction (the Y direction).

Each lens member 60 collimates light that is emitted from each respective light-emitting element 20 and transmitted through the light-transmitting portion 16. The beam combiner 70 causes the respective light emitted from the three lens members 60 to become coaxial, and thus emits combined light in the Z direction, for example.

Figure 13A:
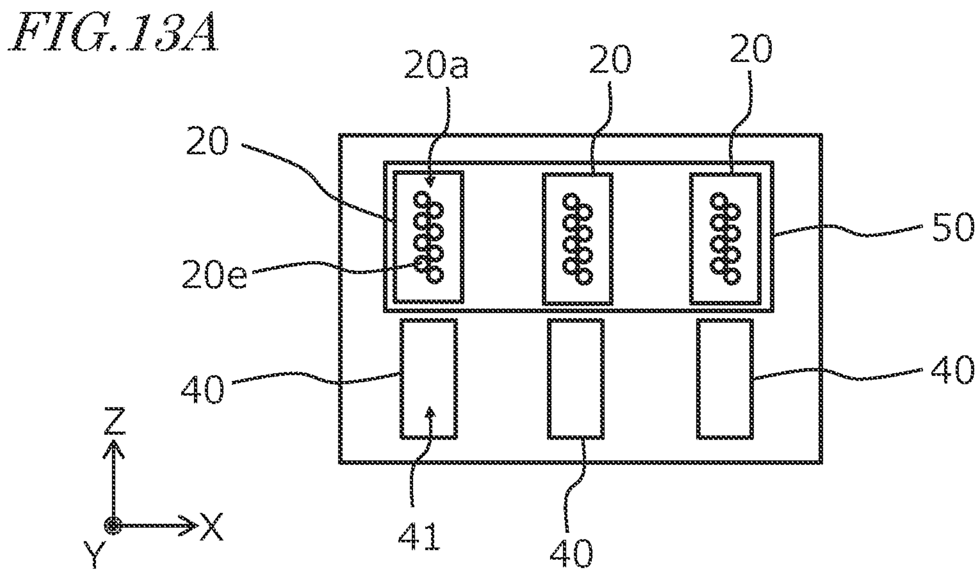
FIG. 13A is a schematic diagram showing an exemplary arrangement of light-emitting elements and light-receiving elements in the case where each light-emitting element has a plurality of emission points.
Figure 13B:
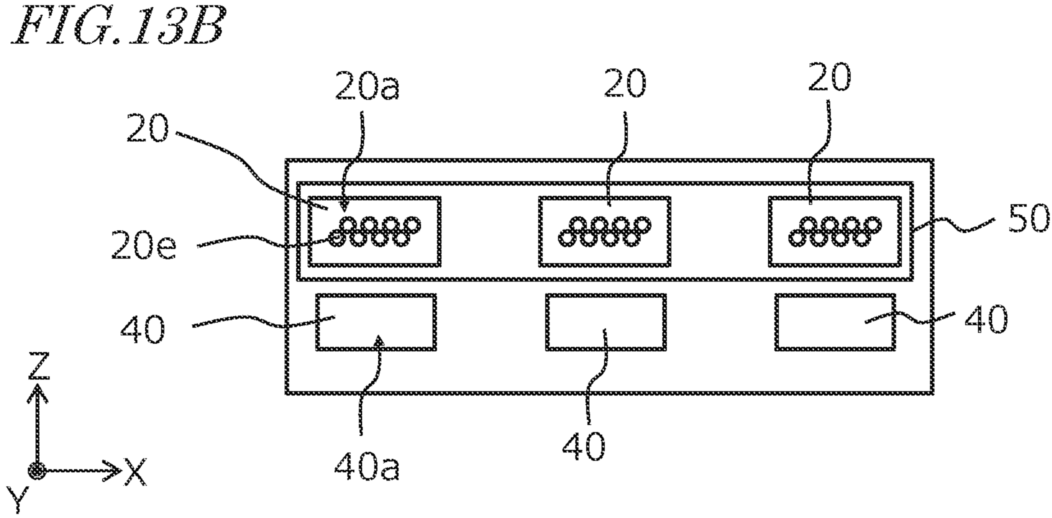
FIG. 13B is a schematic diagram showing another exemplary arrangement of light-emitting elements and light-receiving elements in the case where each light-emitting element has a plurality of emission points.

FIG. 13A and FIG. 13B are schematic diagrams showing an exemplary arrangement of the light-emitting elements 20 and the light-receiving elements 40 in the case where each light-emitting element 20 has a plurality of emission points 20*e*. In the exemplary arrangement shown in FIG. 13A and FIG. 13B, the upper surface 20*a* of each light-emitting element 20 and the light-receiving surface 41 of the light-receiving element 40 are both rectangular. However, as described earlier, these shapes are not limited to being rectangular.

In the example shown in FIG. 13A, the longer sides of the light-receiving surface 41 of each light-receiving element 40 and longer sides of the upper surface 20*a* of each light-emitting element 20 are parallel to the Z direction, whereas the shorter sides of the light-receiving surface 41 of each light-receiving element 40 and the shorter sides of the upper surface 20*a* of each light-emitting element 20 are parallel to the X direction. Such an arrangement allows for reducing the length of the light emitting device 200 on the mounting surface 11M along the X direction.

In the example shown in FIG. 13B, the longer sides of the light-receiving surface 41 of each light-receiving element 40 and the longer sides of the upper surface 20*a* of each light-emitting element 20 are parallel to the X direction, whereas the shorter sides of the light-receiving surface 41 of each light-receiving element 40 and the shorter sides of the upper surface 20*a* of each light-emitting element 20 are parallel to the Z direction. Such an arrangement allows for reducing the length of the light emitting device 200 on the mounting surface 11M along the Z direction. Moreover, the length along the Y direction of the reflecting part 30 disposed above the light-emitting elements 20 and the light-receiving elements 40 can be reduced, which allows for reduction in size of the entire light emitting device 200 along the Y direction.

In both cases of FIG. 13A and FIG. 13B, the longer sides and the shorter sides of the light-emitting elements 20 and the light-receiving elements 40 are aligned, so that the respective light emitted from the plurality of emission points 20*e* can be efficiently incident on the light-receiving surface of each light-receiving element 40.

Modified Example 1 of the Second Embodiment

Figure 14A:
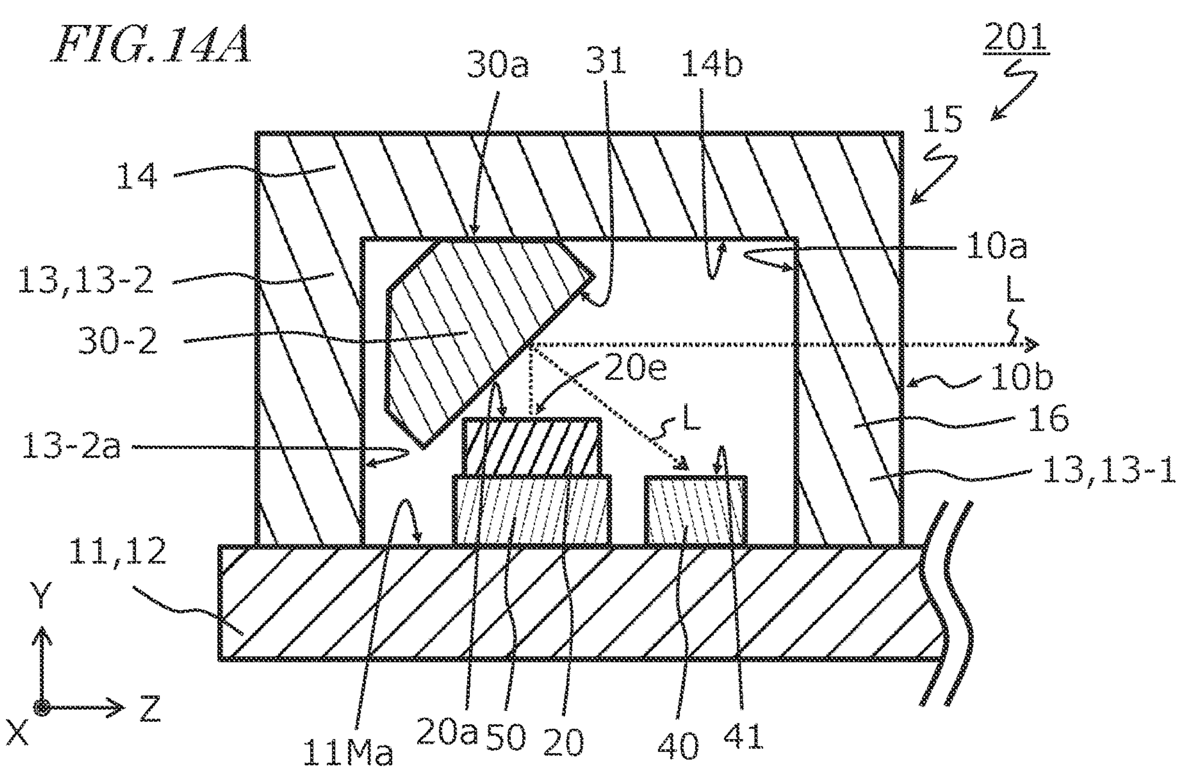
FIG. 14A is a schematic partially enlarged cross-sectional view of a light emitting device according to Modified Example 1 of the second embodiment, showing enlarged a portion of a cross section along a cross-sectional line XIVA-XIVA in FIG. 8.

Next, with reference to FIG. 8, FIG. 14A, and FIG. 14C, Modified Example 1 of the second embodiment will be described. FIG. 8 shows a perspective view of a light emitting device 201 according to Modified Example 1 of the second embodiment. FIG. 14A is a partially enlarged view of the light emitting device 201, showing enlarged a portion of a cross section along a cross-sectional line XIVA-XIVA in FIG. 8. The partially enlarged view of FIG. 14A shows enlarged the portion X1 surrounded by the broken-line box in FIG. 10. FIG. 14C is a top view of the light emitting device 201 in FIG. 14A, from which the cap 15 and a reflecting part 30-2 are omitted. For reference, FIG. 14C shows the outer shape of the first reflection surface 31 of the reflecting part 30-2 with a dotted line.

In this example, in the Z direction, the light-receiving elements 40 are disposed so as to be closer to the light incident surface 10*a* of the first lateral portion 13-1 than are the light-emitting elements 20. The reflecting part 30-2 may include a diffraction optical element on the first reflection surface 31. The diffraction optical element diffracts a portion of light that is emitted from each light-emitting element 20, and allows it to be incident on the light-receiving surface 41 of the light-receiving element 40. In the example of the light emitting device 201 shown in FIG. 14A, the diffraction optical element directs a portion of reflected light toward the light incident surface 10*a*, and the remainder of the reflected light toward the light-receiving surface 41 of the light-receiving element 40. Thus, by using the diffraction optical element, light that is emitted from each light-emitting element 20 and reflected by the first reflection surface 31 can be split into main light and monitoring light.

At least some part of each light-receiving element 40 is located on a straight line extending from the intersection 31*c* (between the first reflection surface 31 and the optical axis of light that is emitted from the light-emitting element 20) to an end of the upper surface 20*a* of each light-emitting element 20 that is ahead of light travel. Thus, with the light-emitting elements 20 and the light-receiving elements 40 disposed close to each other, the light emitting device 200 can be reduced in its size along the direction of light travel.

Modified Example 2 of the Second Embodiment

Figure 14B:
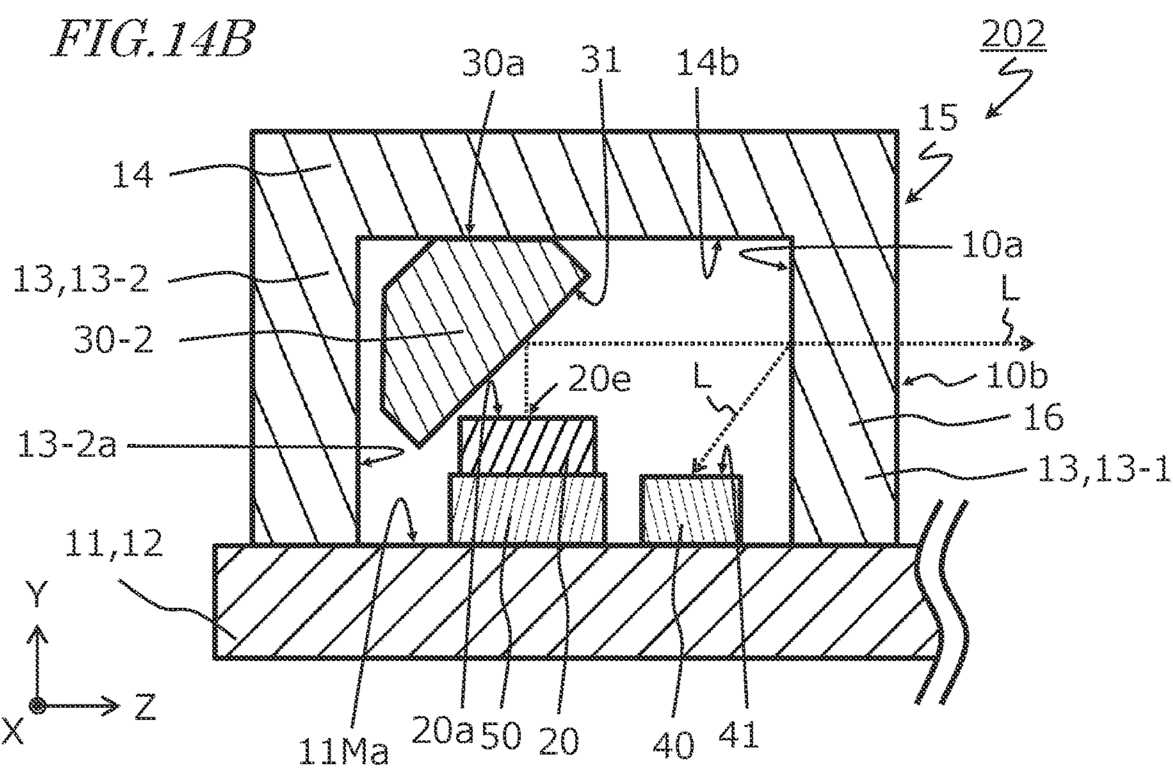
FIG. 14B is a schematic partially enlarged cross-sectional view of a light emitting device according to Modified Example 2 of the second embodiment, showing enlarged a portion of a cross section along a cross-sectional line XIVB-XIVB in FIG. 8.
Figure 14C:
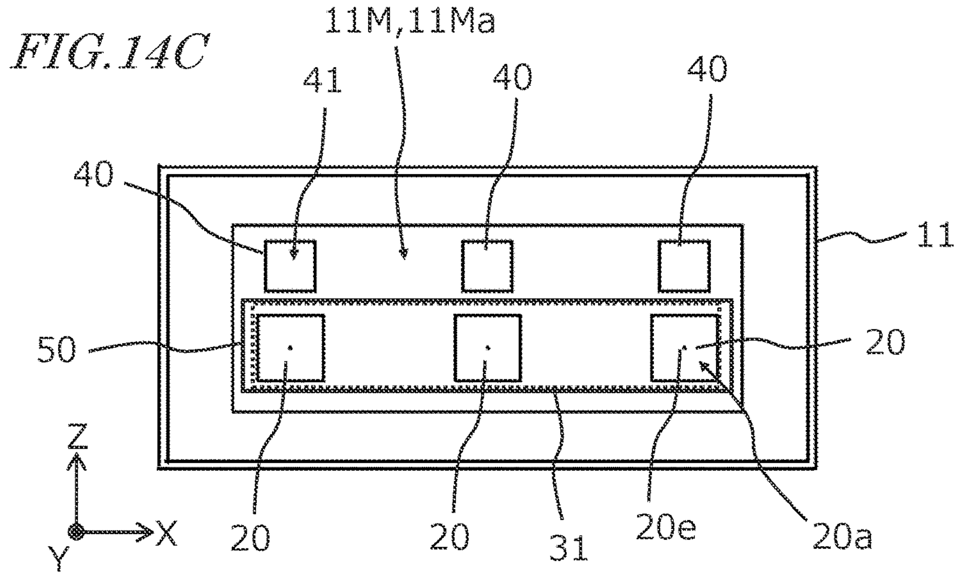
FIG. 14C is a schematic top view of the light emitting device in FIG. 14A and FIG. 14B, from which a cap and a reflecting part are omitted.

With reference to FIG. 8, 14B, and FIG. 14C, Modified Example 2 of the second embodiment will be described. FIG. 8 shows a schematic perspective view of a light emitting device 202 according to Modified Example 2 of the second embodiment. FIG. 14B is a schematic partially enlarged view of the light emitting device 202, showing enlarged a portion of a cross section along a cross-sectional line XIVB-XIVB in FIG. 8. The partially enlarged view of FIG. 14C shows enlarged the portion X1 surrounded by the broken-line box in FIG. 10. FIG. 14C is a top view of the light emitting device 202 in FIG. 8, from which the cap 15 and the reflecting part 30-2 are omitted.

In the light emitting device 202 exemplified in FIG. 14B, the light-transmitting portion 16 includes a diffraction optical element on the light incident surface 10*a*. The diffraction optical element diffracts a portion of light that is reflected from the first reflection surface 31 to be incident on the light-receiving surface 41 of the light-receiving element 40. Also in this example, by using the diffraction optical element, light which is emitted from each light-emitting element 20 and reflected by the first reflection surface 31 can be split into main light and monitoring light.

In accordance with the example configurations of the light emitting devices 201 and 202, the first reflection surface 31 of the reflecting part 30-2 at least partially overlaps each light-emitting element 20 in a top view, similarly to the first reflection surface 31 of the reflecting part 30 of the light emitting device 200. On the other hand, the reflecting part 30-2 does not have the second reflection surface 32. In a top view, the first reflection surface 31 of the reflecting part 30-2 may be provided so as not to overlap the light-receiving surface 41. For example, as compared to the case where the light-emitting elements 20 are disposed closer to the light incident surface 10*a* of the first lateral portion 13-1 than the light-receiving elements 40 are to the light incident surface 10*a*(see FIG. 11A), the size of the entire reflecting part 30-2 can be relatively small.

Modified Example 3 of the Second Embodiment

Figure 15:
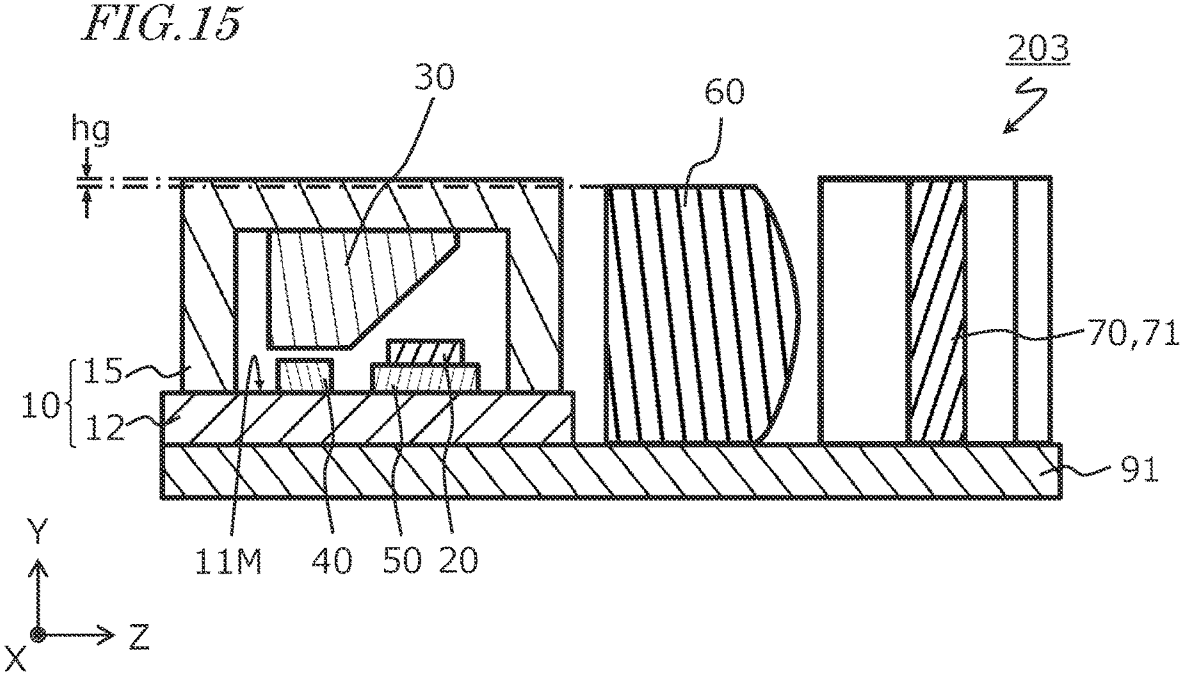
FIG. 15 is a schematic cross-sectional view of a light emitting device according to Modified Example 3 of the second embodiment of the present disclosure.

FIG. 15 is a cross-sectional view showing an example configuration of a light emitting device 203 according to Modified Example 3 of the second embodiment.

The light emitting device 203 exemplified in FIG. 15 includes a further substrate 91 that is not the lower portion 11. The package 10, the three lens members 60, and the beam combiner 70 are disposed on the substrate 91. In the direction normal to the mounting surface 11M, the three lens members 60 and the beam combiner 70 are disposed on a plane that is lower than the mounting surface 11M. The difference hg in height between each lens member 60 and the package 10 (size difference along the Y direction) is e.g. 400 μm or less, and preferably e.g. 200 μm or less. In accordance with this example configuration, disposing the lens members 60 on a plane that is lower than the mounting surface 11M allows the size of each lens member 60 to be relatively large; accordingly, the area of the incident surface 61 can be increased, whereby a main portion of light reflected from the first reflection surface 31 can be efficiently collimated.

Although the light emitting device 200 in FIG. 8 has been illustrated as an exemplary light emitting device that includes one or more lens members 60 and a beam combiner 70, the present disclosure is not limited thereto. For example, the internal configuration of the package 10 of the light emitting device 200 exemplified in FIG. 8 may be replaced by that of the light emitting device exemplified in FIG. 3 or FIG. 6 above.

Third Embodiment

A light emitting device according to a third embodiment differs from the light emitting devices according to the first embodiment and the second embodiment in that the first reflection surface is provided so as to connect to the upper portion and the one or more lateral portions. Hereinafter, the differences will mainly be described, while omitting the description of any common structure.

Figure 16:
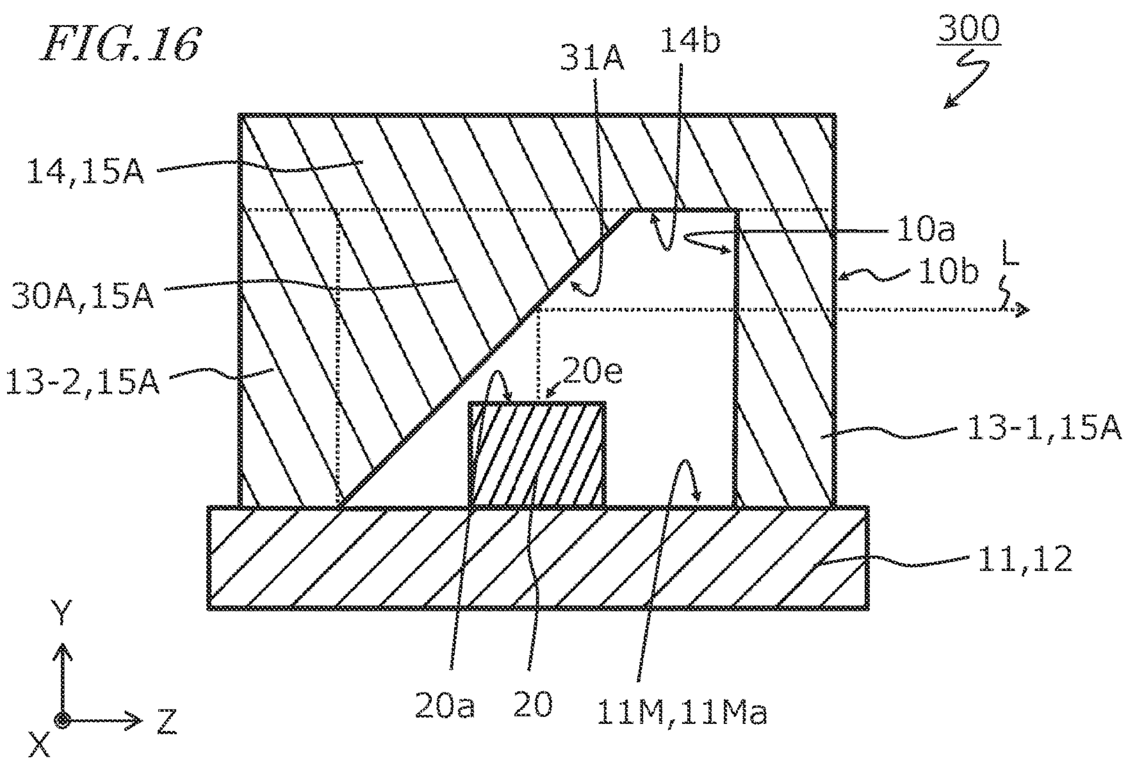
FIG. 16 is a schematic cross-sectional view of a light emitting device according to the third embodiment along a cross-sectional line XVI-XVI in FIG. 1.

With reference to FIG. 1, FIG. 8, FIG. 16, and FIG. 17, the light emitting device according to the third embodiment will be described. FIG. 1 shows a perspective view of a light emitting device 300. FIG. 16 is a cross-sectional view of the light emitting device 300 along a cross-sectional line XVI-XVI in FIG. 1.

The light emitting device 300 includes a lower portion 11, one or more lateral portions 13, an upper portion 14, and one or more light-emitting elements 20. The light emitting device 300 further includes a reflecting part 30A that is monolithically formed with the one or more lateral portions 13 and the upper portion 14.

In the illustrated example, the light emitting device 300 includes a substrate 12, a cap 15A, and three light-emitting elements 20. The substrate 12 includes the lower portion 11. The cap 15A is structured as a monolithic piece that includes a first lateral portion 13-1, a second lateral portion 13-2, the upper portion 14, and the reflecting part 30A. Alternatively, the cap 15A may be composed of: a first cap corresponding to the first lateral portion 13-1; and a second cap that is a monolithic piece including the second lateral portion 13-2, the upper portion 14, and the reflecting part 30A.

In FIG. 16, imaginary boundaries within the cap 15A are indicated by dotted lines between the first lateral portion 13-1, the second lateral portion 13-2, the upper portion 14, and the reflecting part 30A. The boundary between the second lateral portion 13-2 and the reflecting part 30A is on a first imaginary plane that passes through the line of intersection between the second lateral portion 13-2 and the reflecting part 30A and that is perpendicular to the mounting surface 11M. The boundary between the upper portion 14 and the reflecting part 30A is on a second imaginary plane that passes through the line of intersection between the upper portion 14 and the reflecting part 30A and that is parallel to the mounting surface 11M. The reflecting part 30A is defined by a first reflection surface 31A, the first imaginary plane, and the second imaginary plane. The second lateral portion 13-2 has an outer lateral surface. The upper portion 14 has an upper surface and a lower surface 14*b*. The upper surface of the upper portion 14 has an area larger than that of the lower surface 14*b*. The reflecting part 30A has the first reflection surface 31A. The first reflection surface 31A constitutes at least a portion of an inner lateral surface of the cap 15A. The reflecting part 30A does not have any outer lateral surface.

The first reflection surface 31A is provided to be connected to the upper portion 14 and the second lateral portion 13-2. Furthermore, the first reflection surface 31A is provided to be in contact with the mounting surface 11M of the lower portion 11 and the lower surface 14*b* of the upper portion 14. The tilt angle of the first reflection surface 31A relative to the mounting surface 11M is greater than the tilt angle of the lower surface 14*b* relative to the mounting surface 11M. In the illustrated example, the lower surface 14*b* is parallel to the mounting surface 11M. This arrangement allows for reduction in size of the entire light emitting device 300 along the Y direction. As used herein, being "parallel to" allows for a tolerance within ±3 degrees.

The one or more light-emitting elements 20 are disposed on the mounting surface 11M of the lower portion 11. In a top view, each light-emitting element 20 is disposed so as to overlap the first reflection surface 31. In a top view, the light-emitting element 20 does not overlap the lower surface 14*b*. In the direction of light travel, the length of the first reflection surface 31A is greater than the length of the lower surface 14*b*. The length of the first reflection surface 31A may be three times the length of the lower surface 14*b*, for example. In the direction of light travel, the ratio of the distance between the light incident surface 10*a* of the first lateral portion 13-1 and the emission point 20*e* of the light-emitting element 20 to the distance between the boundary between the first reflection surface 31A and the second lateral portion 13-2 and the emission point 20*e* of the light-emitting element 20 is e.g. 0.2 to 5 times. In the illustrated example, the point at which the first reflection surface 31A and the mounting surface 11M connect is the boundary between the first reflection surface 31A and the second lateral portion 13-2.

On the surface of the reflecting part 30A that is contained by the cap 15A (i.e., the first reflection surface 31A), a light reflection control film, a diffraction optical element, or a DBR film may be provided, for example. On the light incident surface 10*a* of the first lateral portion 13-1 included in the cap 15A, an antireflection coating may be formed.

Modified Example of the Third Embodiment

Figure 17:
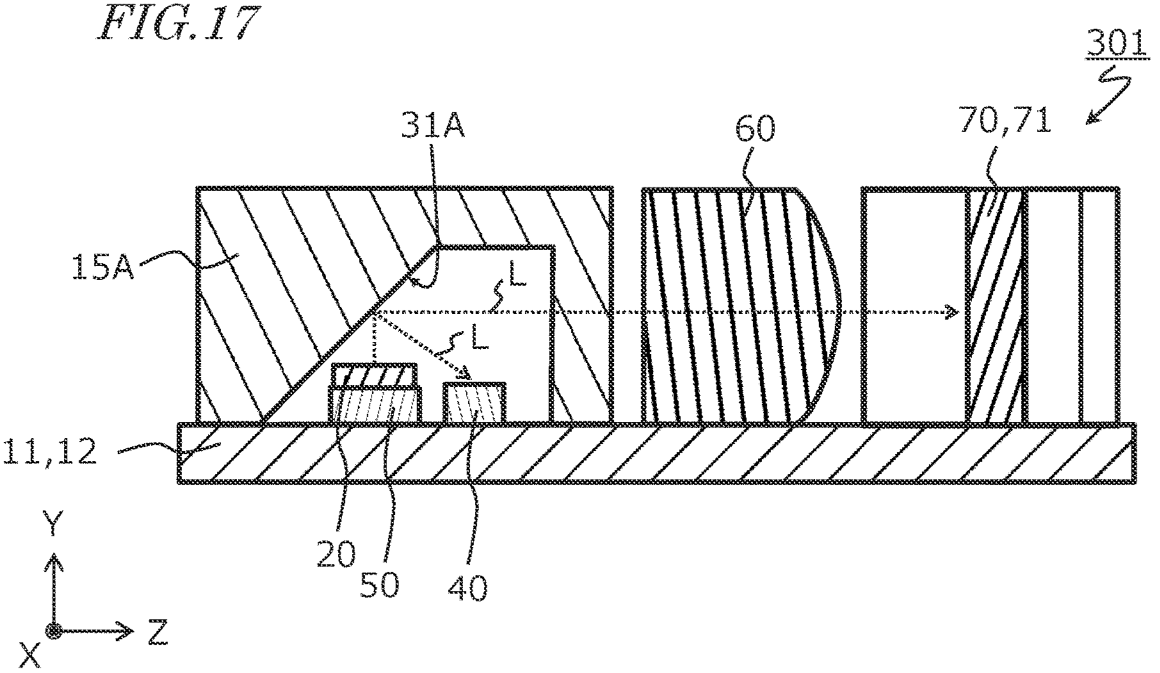
FIG. 17 is a schematic cross-sectional view showing another example structure of a light emitting device according to the third embodiment along a cross-sectional line XVII-XVII in FIG. 8.

FIG. 8 is a perspective view showing an example configuration of a light emitting device 301 according to a modified example of the third embodiment. FIG. 17 is a cross-sectional view of the light emitting device 301 along a cross-sectional line XVII-XVII in FIG. 8. In addition to the components of light emitting device 300 according to the third embodiment, the light emitting device 301 according to the modified example of the third embodiment further includes one or more light-receiving elements 40, a submount 50, one or more lens members 60, and a beam combiner 70. Because the upper portion, the lateral portions, and the reflecting part are monolithically formed, the entire light emitting devices 300, 301 according to the third embodiment can be downsized.

Fourth Embodiment

A light emitting device according to a fourth embodiment differs from the light emitting devices according to the first to third embodiments in that a lens member is disposed within a closed space defined by a lower portion, lateral portions, and an upper portion. Hereinafter, the differences will mainly be described, while omitting the description of any common structure.

Figure 18:
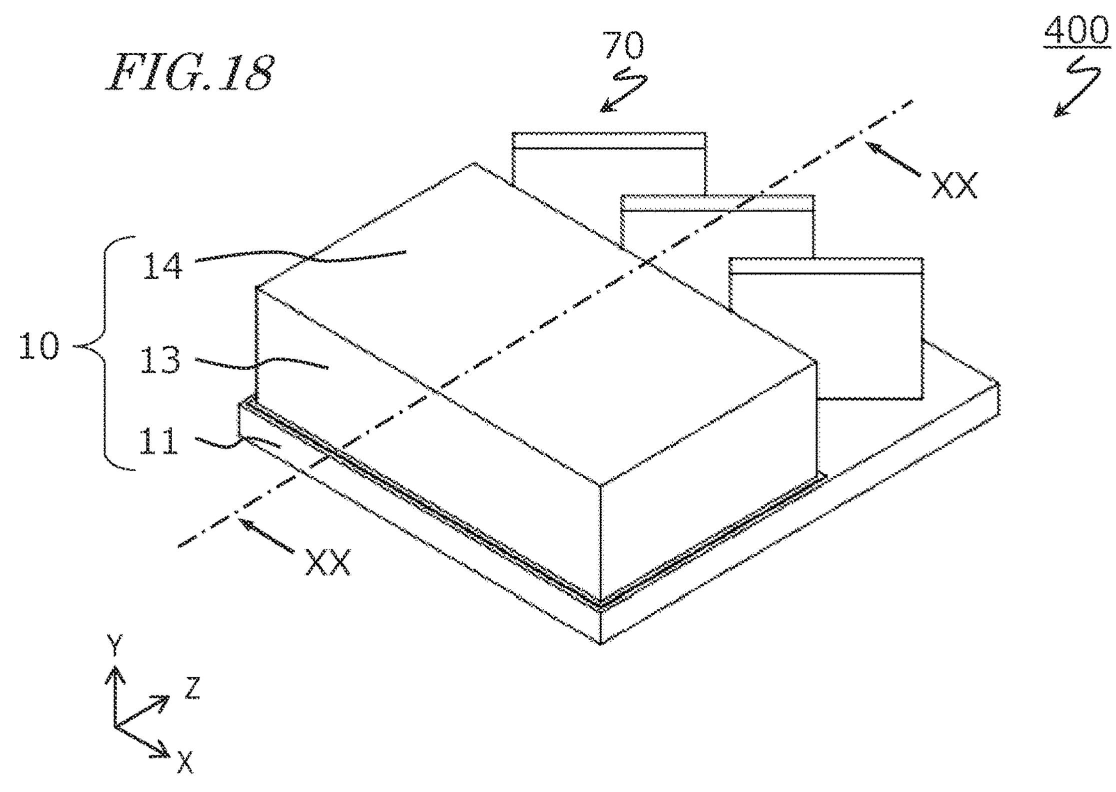
FIG. 18 is a schematic perspective view of a light emitting device according to a fourth embodiment of the present disclosure.
Figure 19:
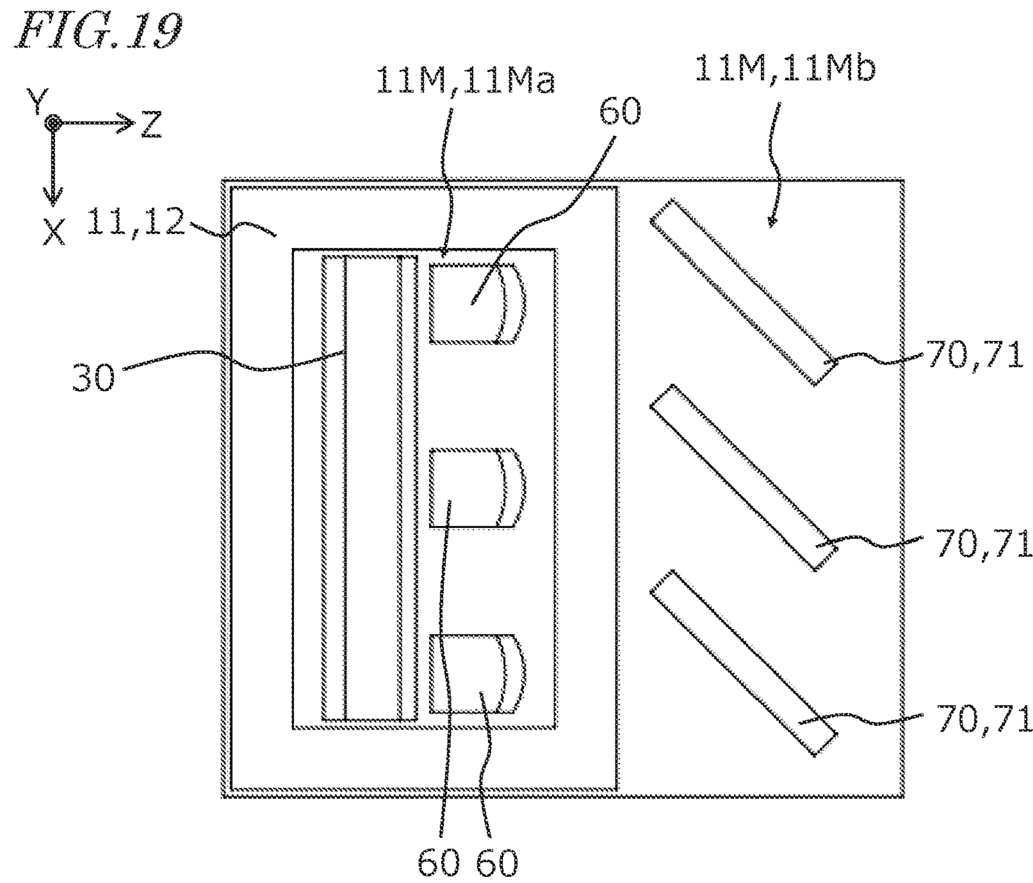
FIG. 19 is a schematic top view of the light emitting device shown in FIG. 18, from which a cap is omitted.
Figure 20:
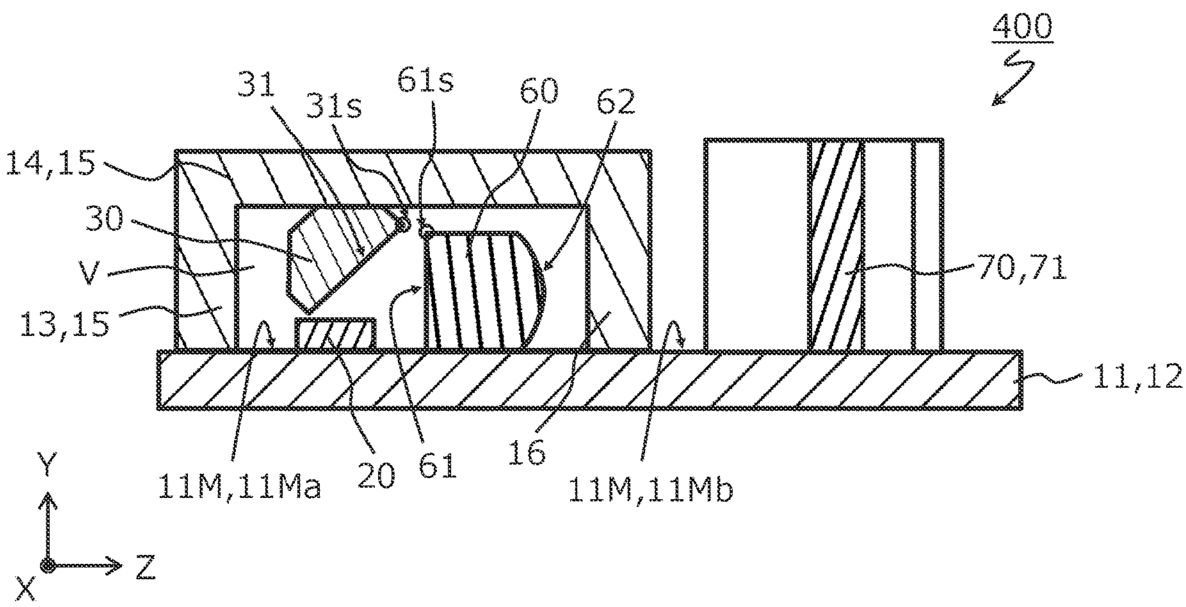
FIG. 20 is a schematic cross-sectional view of the light emitting device shown in FIG. 18 along a cross-sectional line XX-XX.

With reference to FIG. 18 to FIG. 20, a light emitting device 400 according to the fourth embodiment. FIG. 18 is a perspective view of the light emitting device 400. FIG. 19 is a top view of the light emitting device 400, from which a cap 15 is omitted. FIG. 20 is a cross-sectional view of the light emitting device 400 along a cross-sectional line XX-XX in FIG. 18.

In the light emitting device 400, one or more lens members 60 are disposed in a first mounting region 11Ma. The one or more lens members 60 are disposed within a closed space V defined by a lower portion 11, one or more lateral portions 13, and an upper portion 14. In the illustrated example, the light emitting device 400 includes a plurality of light-emitting elements 20, a reflecting part 30, a plurality of lens members 60, and a beam combiner 70. The plurality of light-emitting elements 20, the reflecting part 30, and the plurality of lens members 60 are disposed within the closed space V created by the substrate 12 and the cap 15. The beam combiner 70 is disposed in a second mounting region 11Mb, beyond the cap 15.

The distance between an end of the light-emitting element 20 that is 0119 the farthest ahead of light travel and the incident surface 61 of the lens member 60 is shorter than the length of each light-emitting element 20 along the direction of light travel. Such a distance allows for reducing the length of the entire light emitting device 400 along the direction of light travel. Moreover, with each lens member 60 disposed close to the light-emitting element 20, the optical path length traveled by light emitted from the light-emitting element 20 until being incident on the incident surface 61 of the lens member 60 can be reduced. Because this allows for reducing the irradiated region on the incident surface 61 of the lens member 60, the dimension of the lens member 60 along the height direction, i.e., the Y direction, can be downsized. The distance from an end of the light-emitting element 20 that is the farthest ahead of light travel to the incident surface 61 may be e.g. 500 μm or less.

In the direction normal to the mounting surface 11M, a highest point 61*s* of the incident surface 61 of the lens member 60 is located below a highest point 31*s* of the first reflection surface 31 of the reflecting part 30. With the lens member 60 having such a dimension along the height direction, the entirety of the light emitting device 400 can be reduced in size. In the direction normal to the mounting surface 11M, the highest point 61*s* of the incident surface 61 of the lens member 60 is located above the midpoint 31*m* of the first reflection surface 31 of the reflecting part 30 (see FIG. 5 in connection with the first embodiment). With the lens member 60 having such a dimension along the height direction, a main portion of the light reflected from the first reflection surface 31 can be efficiently introduced onto the incident surface 61.

Fifth Embodiment

A light emitting device according to a fifth embodiment differs from the light emitting devices according to the first to fourth embodiments in that it includes a plurality of light-emitting elements, among which VCSEL elements and an edge-emitting laser element are included. Hereinafter, the differences will mainly be described, while omitting the description of any common structure. In the following description, the VCSEL elements and the edge-emitting laser element will respectively be denoted as first light-emitting elements 20*s* and a second light-emitting element 20*t* for mutual distinction.

Figure 21:
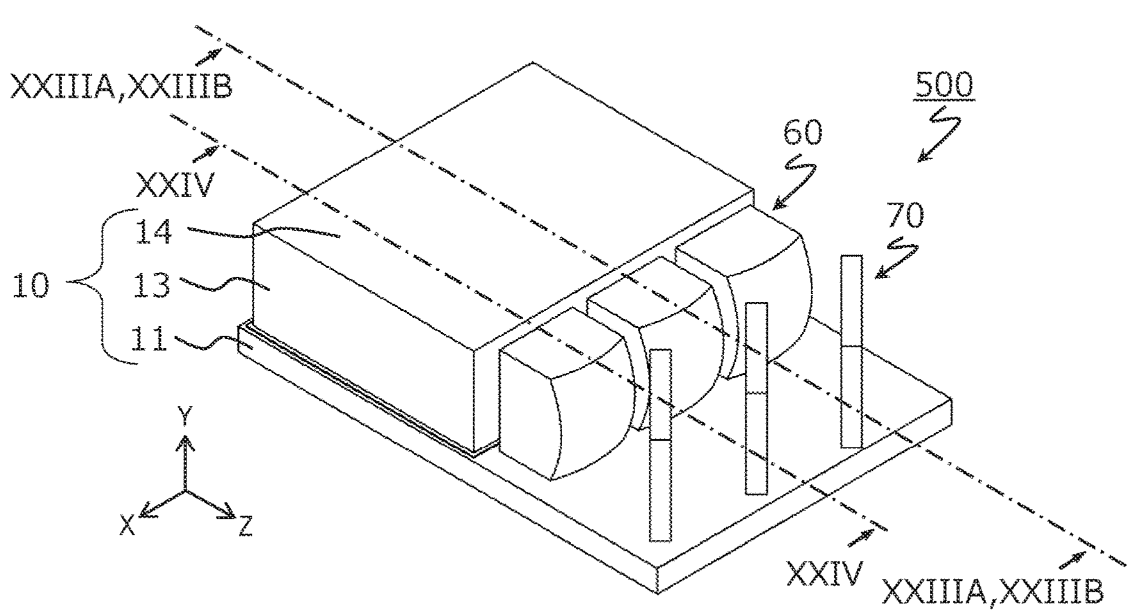
FIG. 21 is a schematic perspective view of a light emitting device according to a fifth embodiment of the present disclosure.
Figure 22:
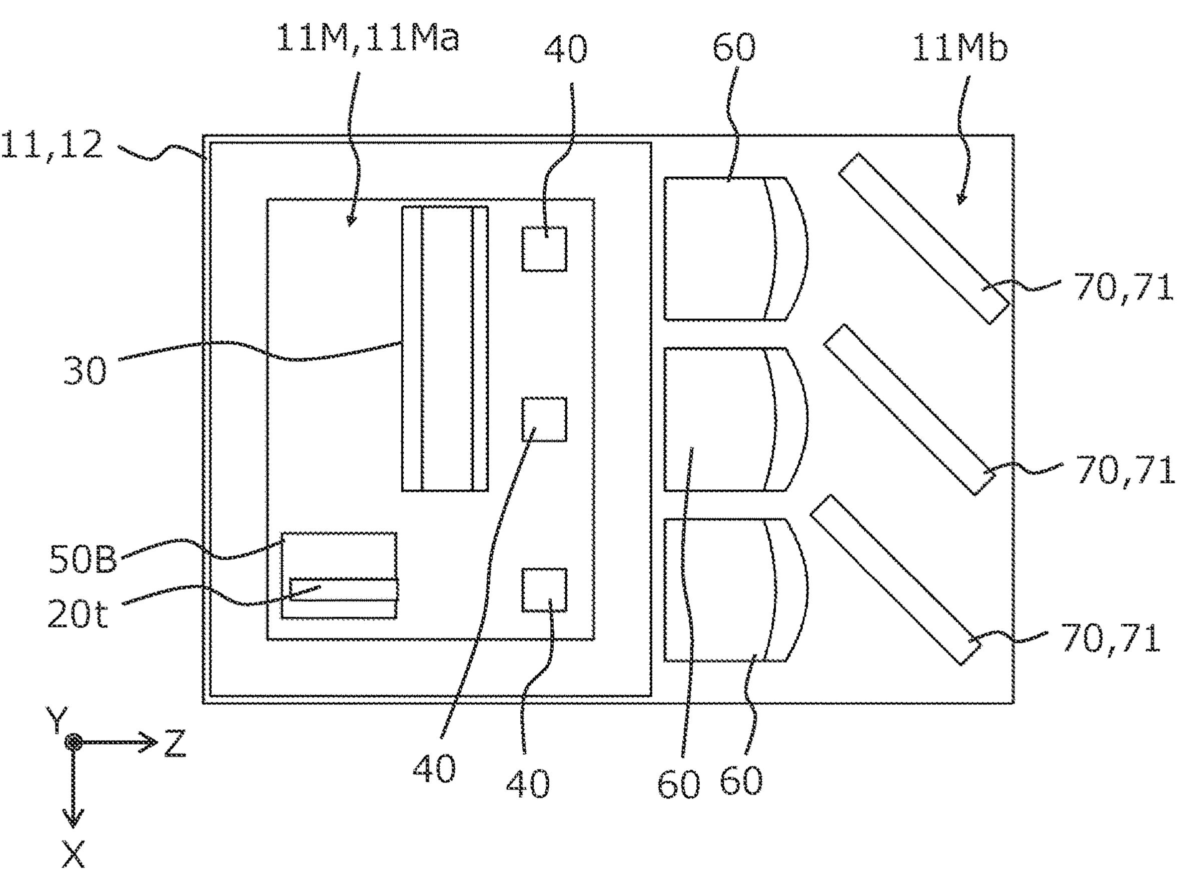
FIG. 22 is a schematic top view of the light emitting device shown in FIG. 21, from which a cap is omitted.
Figure 23A:
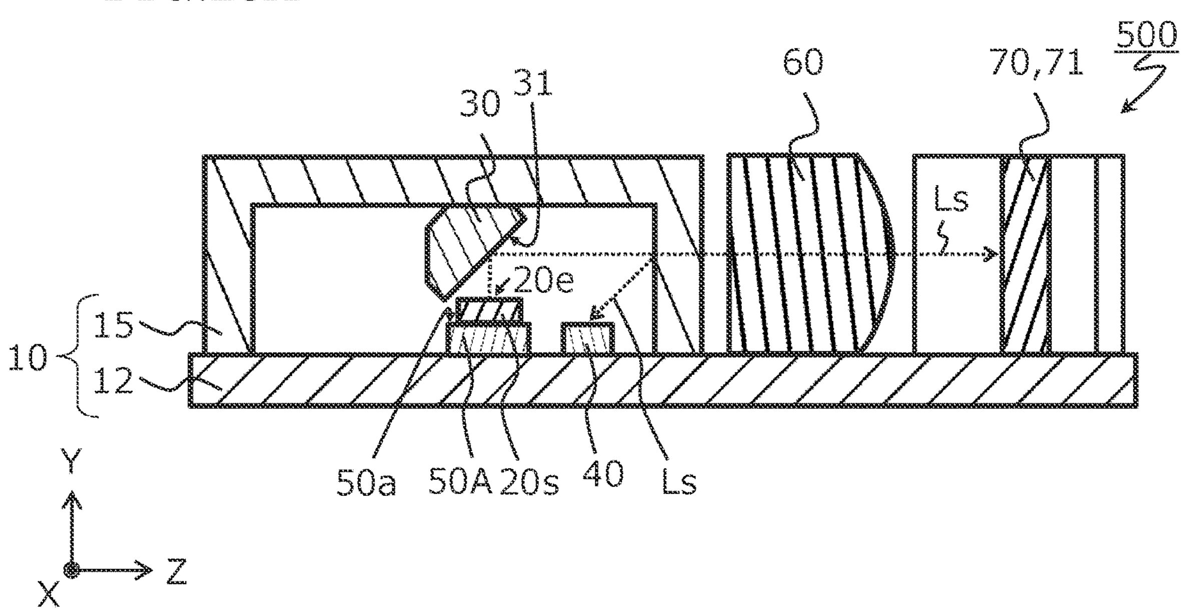
FIG. 23A is a schematic cross-sectional view of the light emitting device according to the fifth embodiment along a cross-sectional line XXIIIA-XXIIIA in FIG. 21.
Figure 23B:
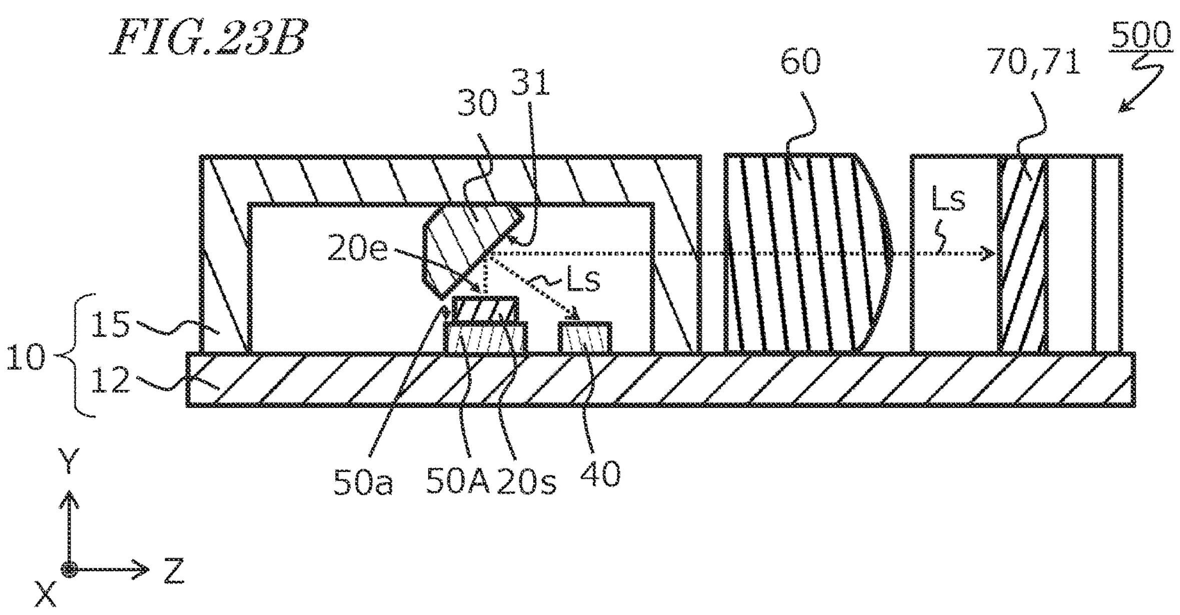
FIG. 23B is a schematic cross-sectional view showing another example structure of the light emitting device according to the fifth embodiment along a cross-sectional line XXIIIB-XXIIIB in FIG. 21.
Figure 24:
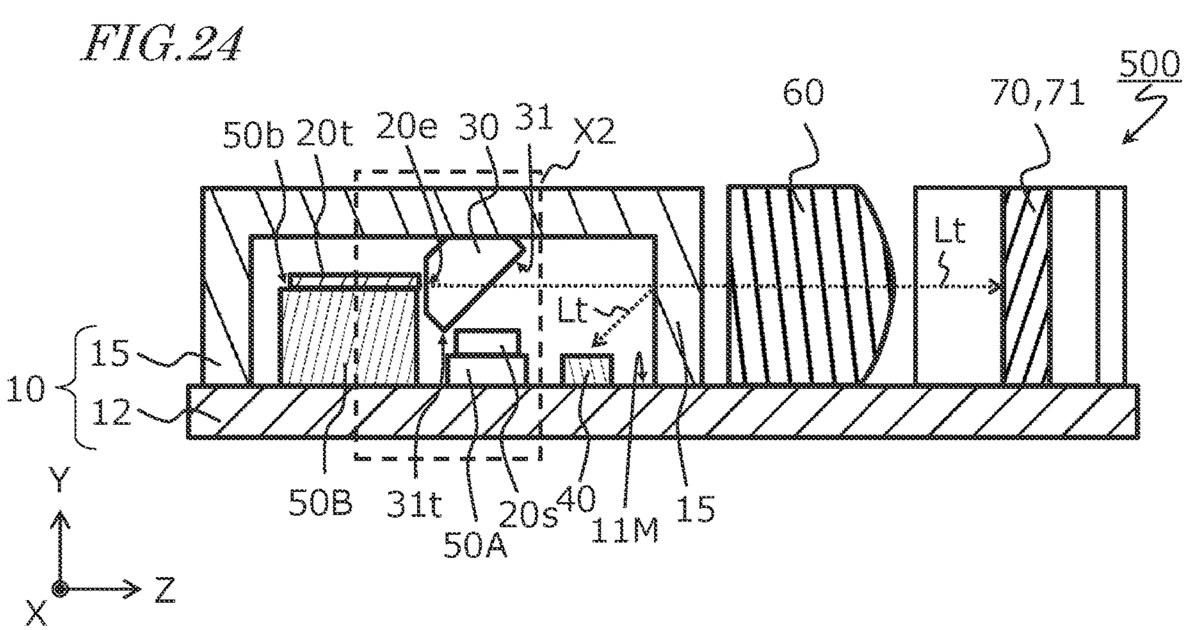
FIG. 24 is a schematic cross-sectional view of the light emitting device shown in FIG. 21 along a cross-sectional line XXIV-XXIV.
Figure 25:
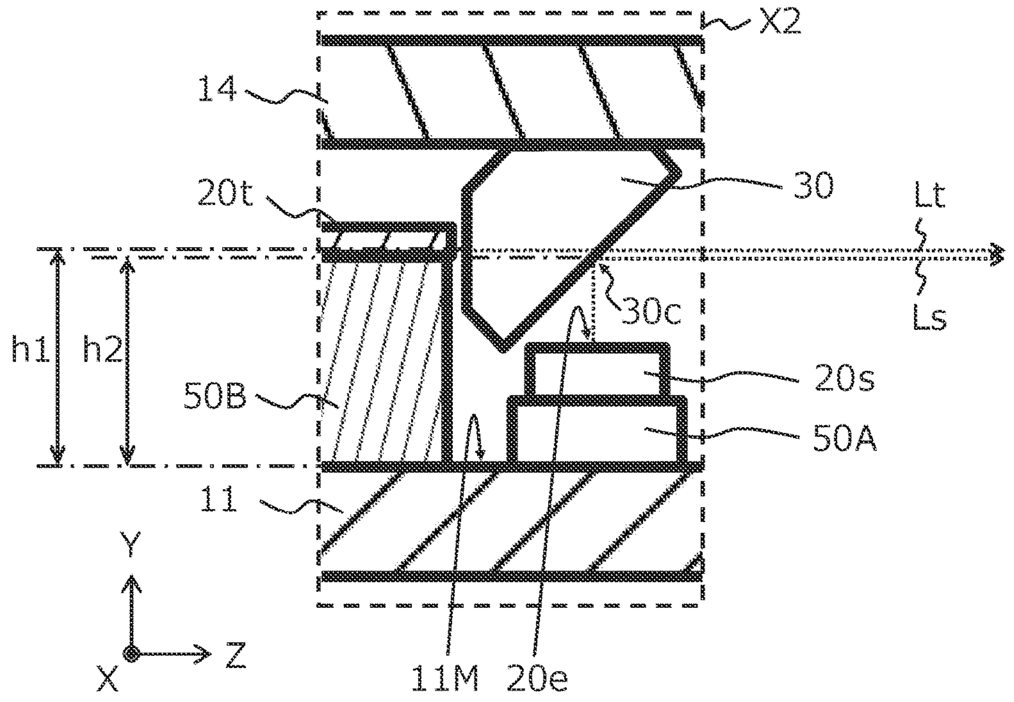
FIG. 25 is a schematic enlarged cross-sectional view showing enlarged a portion X2 in the cross-sectional view of FIG. 24.

With reference to FIG. 21 to FIG. 25, a light emitting device 500 according to the fifth embodiment will be described. FIG. 21 is a schematic perspective view of the light emitting device 500. FIG. 22 is a schematic top view of the light emitting device 500, from which the cap 15 is omitted. FIG. 23A is a schematic cross-sectional view of the light emitting device 500 along a cross-sectional line XXIIIA-XXIIIA in FIG. 21. FIG. 23B is a schematic cross-sectional view of another example structure for the light emitting device 500 along a cross-sectional line XXIIIB-XXIIIB in FIG. 21. FIG. 24 is a schematic cross-sectional view of the light emitting device 500 along a cross-sectional line XXIV-XXIV in FIG. 21. FIG. 25 is a schematic partially enlarged view of a portion X2 in the cross-sectional view of FIG. 24. FIG. 25 shows enlarged the first light-emitting elements 20*s*, the second light-emitting element 20*t*, a reflecting part 30, and their vicinities.

The light emitting device 500 exemplified in FIG. 21 includes two first light-emitting elements 20*s* and one second light-emitting element 20*t*. The quantity of first light-emitting elements 20*s* and the number of second light-emitting elements 20*t* are not limited thereto. The two first light-emitting elements 20*s* and one second light-emitting element 20*t* are disposed on a mounting surface 11M, and located inside the package 10. For example, one of the two first light-emitting elements 20*s* emits blue light, and the other emits green light. The second light-emitting element 20*t* emits red light.

The second light-emitting element 20*t* has one or more emission points 20*e* from which light is emitted in a direction parallel to the mounting surface 11M. The light emitted from the second light-emitting element 20*t* is transmitted through the light-transmitting portion 16 so as to be emitted outside. The main portion of light emitted from the second light-emitting element 20*t* may have an FFP of an elliptical shape, for example. The angle of divergence of light emitted from the second light-emitting element 20*t* along the fast-axis direction is greater than the angle of divergence of light emitted from each first light-emitting element 20*s* in the direction along its diameter.

As in the example shown in FIG. 23A, light Ls emitted from each first light-emitting element 20*s* is reflected from the first reflection surface 31 in a lateral direction. At the light incident surface 10*a*, the light Ls being reflected from the first reflection surface 31 and traveling in the lateral direction is split into: light Ls that is transmitted through the light incident surface 10*a*; and light Ls that is reflected therefrom. The light Ls transmitted through the light incident surface 10*a* is incident on the incident surface of the lens member 60. The light Ls reflected from the light incident surface 10*a* is incident on the upper surface of the light-receiving element 40.

Instead of splitting at the light incident surface 10*a*, the light Ls emitted from each first light-emitting element 20*s* may be split at other components. As in an example shown in FIG. 23B, the light Ls emitted from each first light-emitting element 20*s* may be split into: light Ls that is reflected from the first reflection surface 31 of the reflecting part 30 and travels in a lateral direction so as to be incident on the light incident surface 10*a*; and light that is incident on the upper surface of the light-receiving element 40.

As in the example shown in FIG. 24, the light Lt emitted from the second light-emitting element 20*t* travels in a lateral direction. At the light incident surface 10*a*, the light Lt traveling in the lateral direction is split into: light Lt that is transmitted through the light incident surface 10*a*; and light Lt that is reflected therefrom. The light Ls transmitted through the light incident surface 10*a* is incident on the incident surface of the lens member 60. The light Ls reflected from the light incident surface 10*a* is incident on the upper surface of the light-receiving element 40.

In the direction of light travel, the distance from the emission point of each first light-emitting element 20*s* to the light incident surface 10*a* is shorter than the distance from the emission point of the second light-emitting element 20*t* to the light incident surface 10*a*. Such an arrangement allows the optical path length of the light Ls that is emitted from each first light-emitting element 20*s* and reflected from the first the reflection surface 31 until being incident on the light incident surface 10*a* to be close to the optical path length of the light Lt that is emitted from the second light-emitting element 20*t* until being incident on the light incident surface 10*a*. In the illustrated example, in a side view as viewed from the X direction, the emission end faces of the second light-emitting element 20*t* and each first light-emitting element 20*s* do not overlap.

The light emitting device 500 further includes a submount 50 disposed on the mounting surface 11M. As illustrated in the drawings, the first light-emitting elements 20*s* and the second light-emitting element 20*t* are disposed on an upper surface 50*a* of a first submount 50A and an upper surface 50*b* of a second submount 50B, respectively. In the direction normal to the mounting surface 11M, the distance from mounting surface 11M to the upper surface 50*b* of the second submount 50B is greater than the distance from the mounting surface 11M to the lowest point 31*t* of the first reflection surface 31. This can allow the height (along the Z direction) of the optical axis of light from the second light-emitting element 20*t* passing through the light-transmitting to be close to the height (along the Z direction) of the optical axis of light that is emitted from each first light-emitting element 20*s* and passes through the light-transmitting portion 16.

In the light emitting device 500, the height h1 from the mounting surface 11M to the emission point 20*e* of the second light-emitting element 20*t* is preferably equal to the height h2 from the mounting surface 11M to the intersection 31*c* between the first reflection surface 31 and the optical axis of light Ls emitted from the emission point 20*e* of each first light-emitting element 20*s*. Disposing the second light-emitting element 20*t* on the second submount 50B and adjusting the thickness of the second submount 50B allows the height h1 and the height h2 to be equal to each other. The absolute value of the difference between the height h1 and the height h2 is preferably e.g. 300 μm or less, and more preferably 100 μm or less. With the height h1 and the height h2 equal to each other, the size of the three lens members 60 for collimating the optical axes of light that is emitted from the first light-emitting elements 20*s* and the light that is emitted from the second light-emitting element 20*t* along the height direction can be equal to each other. Moreover, the height of the optical axis of collimated light emitted from each exiting surface 62 can be equal to each other.

The absolute value of the difference in thickness between the first submount 50A on which the two first light-emitting elements 20*s* are disposed and the second submount 50B on which the second light-emitting element 20*t* is disposed is preferably e.g. 1 mm or less, and more preferably not less than 100 μm and not more than 500 μm. Thus, by adjusting the height of the first submount 50A on which the first light-emitting elements 20*s* are disposed and the height of the second submount 50B on which the second light-emitting element 20*t* is disposed, the height h1 and the height h2 can be made equal. Instead of the first submount 50A and the second submount 50B, the light emitting device 500 may be configured so that the lower portion 11 includes protrusions at positions where the first light-emitting elements 20*s* and the second light-emitting element 20*t* are to be disposed. Alternatively, the first light-emitting elements 20*s* may be disposed directly on the mounting surface 11M, whereas the second light-emitting element 20*t* may be disposed on the upper surface of the second submount 50B.

In accordance with the light emitting device 500 according to the fifth embodiment, a novel light emitting device is provided in which VCSEL elements and an edge-emitting laser element are both incorporated, such that light is emitted in a lateral direction from the package. This allows for a broader range of light-emitting elements to be mounted on the light emitting device, thus providing flexible solutions. A light emitting device that includes RGB light-emitting elements can be suitably used in a backlight for a display.

Sixth Embodiment

A light emitting device according to a sixth embodiment differs from the light emitting devices according to the first to fifth embodiments in that at least a part of the lateral portions includes an opening and a sealing portion provided on the opening. Hereinafter, the differences will mainly be described, while omitting the description of any common structure.

Figure 26:
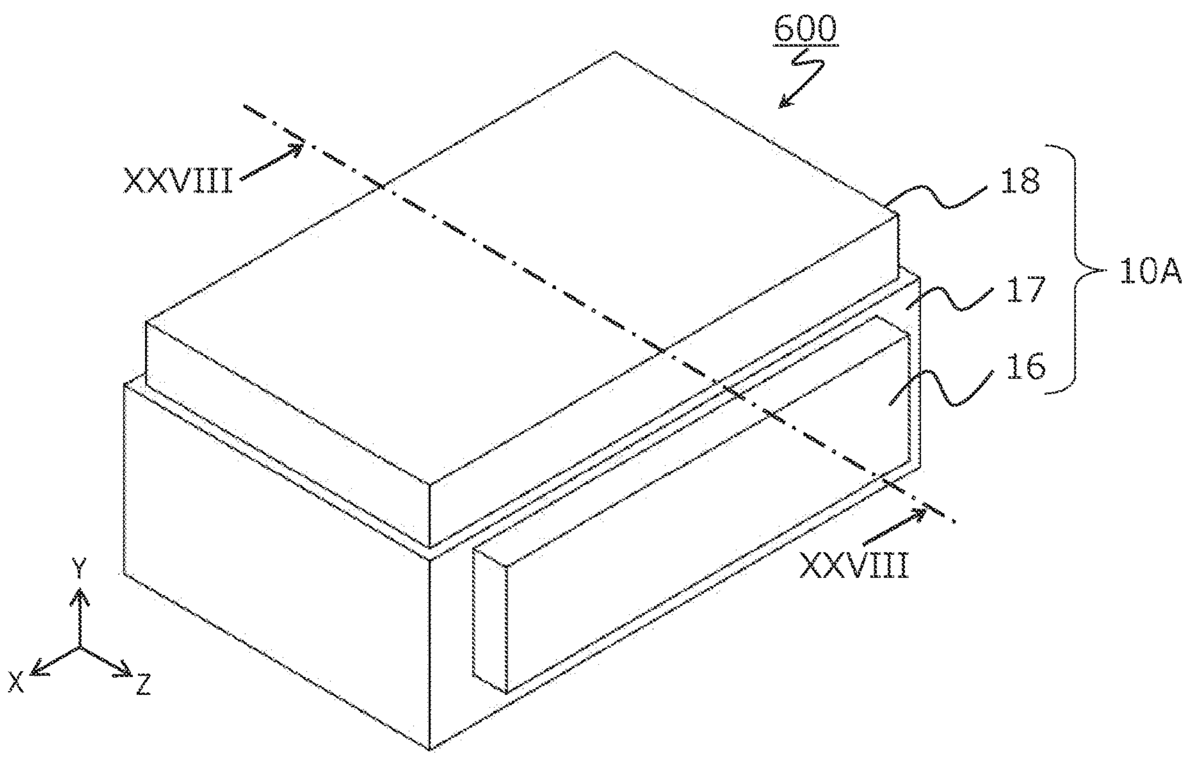
FIG. 26 is a schematic perspective view of a light emitting device according to a sixth embodiment of the present disclosure.
Figure 27:
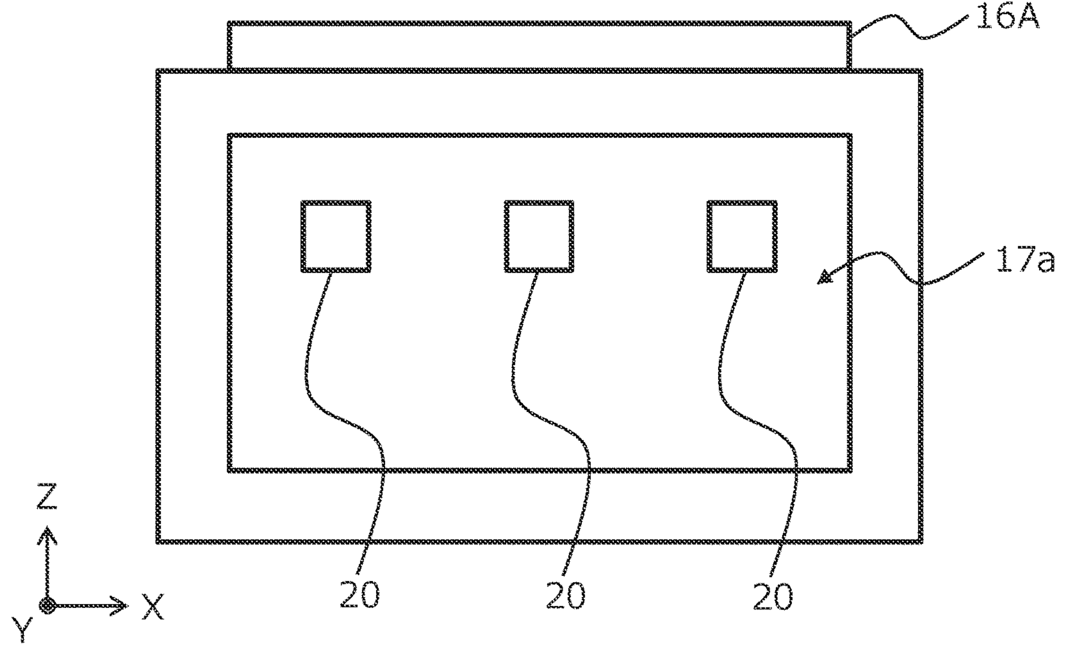
FIG. 27 is a schematic top view of the light emitting device shown in FIG. 26, from which a cover is omitted.
Figure 28:
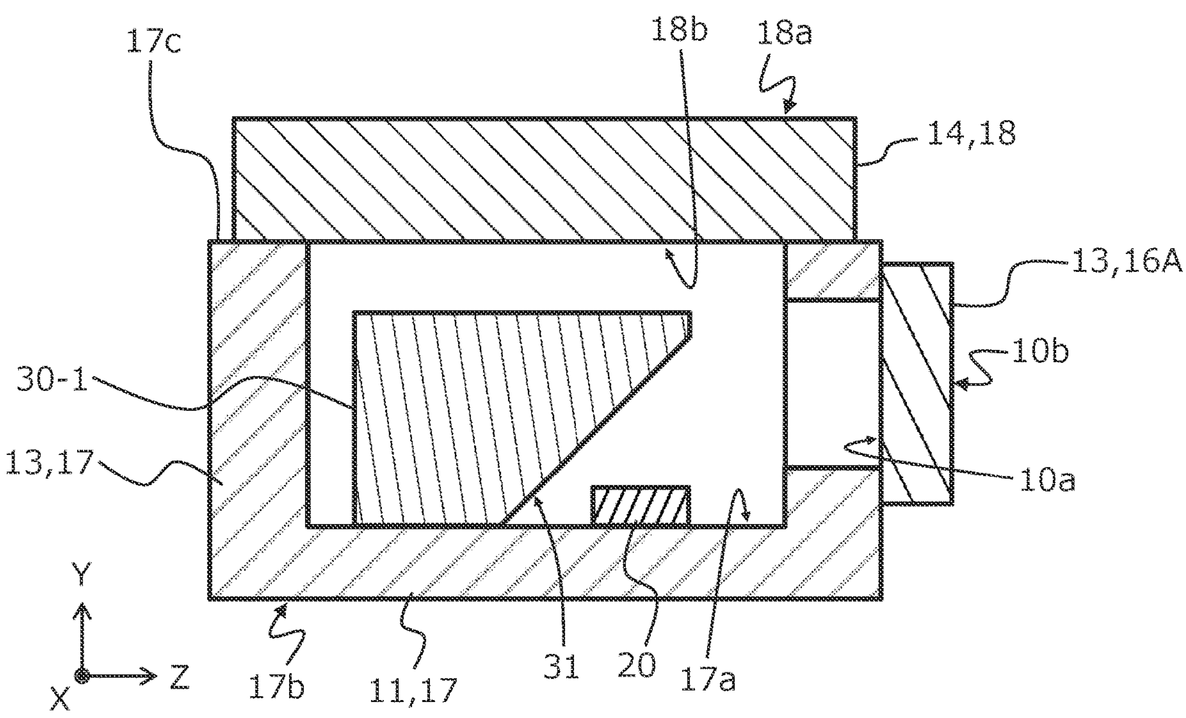
FIG. 28 is a schematic cross-sectional view of the light emitting device shown in FIG. 26 along a cross-sectional line XXVIII-XXVIII.

With reference to FIG. 26 to FIG. 30, light emitting devices 600 and 601 according to the sixth embodiment will be described. FIG. 26 is a perspective view of the light emitting device 600. FIG. 27 is a top view of the light emitting device 600 shown in FIG. 26, from which a cover 18 is omitted. FIG. 28 is a cross-sectional view of the light emitting device 600 along a cross-sectional line XXVIII-XXVIII in FIG. 26.

Package 10A

The package 10A includes a sealing portion 16A, a cavity 17 having a concaved shape, and the cover 18. The cavity 17 includes: a bottom surface 17*a*; a lower surface 17*b* located at an opposite side from the bottom surface 17*a*; one or more inner lateral surfaces that connect to the bottom surface 17*a*; one or more outer lateral surfaces that connect to the lower surface 17*b*; and an upper surface 17*c* that connects to the inner lateral surface(s) and the outer lateral surface(s). The cover 18 is bonded to the upper surface 17*c* of the cavity 17. The cover 18 includes: an upper surface 18*a*; and a lower surface 18*b* that is located at an opposite side from the upper surface 18*a* and that is bonded to the upper surface 17*c* of the cavity 17.

The cavity 17 has an opening that via which one inner lateral surface and the opposing outer lateral surface of the cavity 17 communicate. Furthermore, the sealing portion 16A is provided on the opening of the cavity 17. The sealing portion 16A, the cavity 17, and the cover 18 together create a sealed space V. The sealing portion 16A is made of a light-transmissive material, e.g., a glass, a plastic, quartz, or sapphire. The cavity 17 can be made of a ceramic, a metal or the like as a main material. The cover 18 can be made of a metal or the like, for example. Thus, the fact that the sealing portion 16A is the only light-transmissive region makes it less likely for light to leak from anywhere other than the sealing portion 16A.

Note that, as in the other embodiments, the package 10A may be regarded as having a lower portion 11, lateral portions 13, and an upper portion 14. In the present embodiment, the portion of the cavity 17 that is on the lower surface 17*b* side of the bottom surface 17*a* is the lower portion 11, while the other portions are the lateral portions 13. The lateral portions 13 include the sealing portion 16A being provided over the opening. The lateral portion 13 on which the sealing portion 16A is provided is the first lateral portion 13-1. The cover 18 is the upper portion 14.

Light Emitting Device 600

One or more light-emitting elements 20 and a reflecting part are to be disposed in the sealed space V. The reflecting part in the illustrated example is the reflecting part 30-1 in the first embodiment. In the illustrated example, the one or more light-emitting elements 20 are three VCSEL elements. Light that is emitted from the upper surface(s) of the one or more light-emitting elements 20 is reflected at the first reflection surface 31 of the reflecting part 30-1 and travels in a lateral direction. The light traveling in the lateral direction is incident on the inner lateral surface of the sealing portion 16A that is in contact with the sealed space V, and is emitted from the opposing outer lateral surface. In the present embodiment, the inner lateral surface is the light incident surface 10*a*, whereas the outer lateral surface is the light extraction surface 10*b*. Regarding the traveling direction of the light passing through the sealing portion 16A, the light incident surface 10*a* is located ahead of light travel relative to the outer lateral surface of the cavity 17.

The one or more light-emitting elements 20 and the reflecting part 30-1 are disposed on the bottom surface 17*a*, side by side along a perpendicular direction to the light incident surface 10*a*. These components are bonded to the bottom surface 17*a* with a metal adhesive, for example. Regarding a perpendicular direction to the light incident surface 10*a*, the one or more light-emitting elements 20 are bonded to the bottom surface 17*a* at a position(s) that is closer to the light incident surface 10*a* than where the reflecting part 30-1 is bonded.

Modified Example of the Sixth Embodiment

Figure 29:
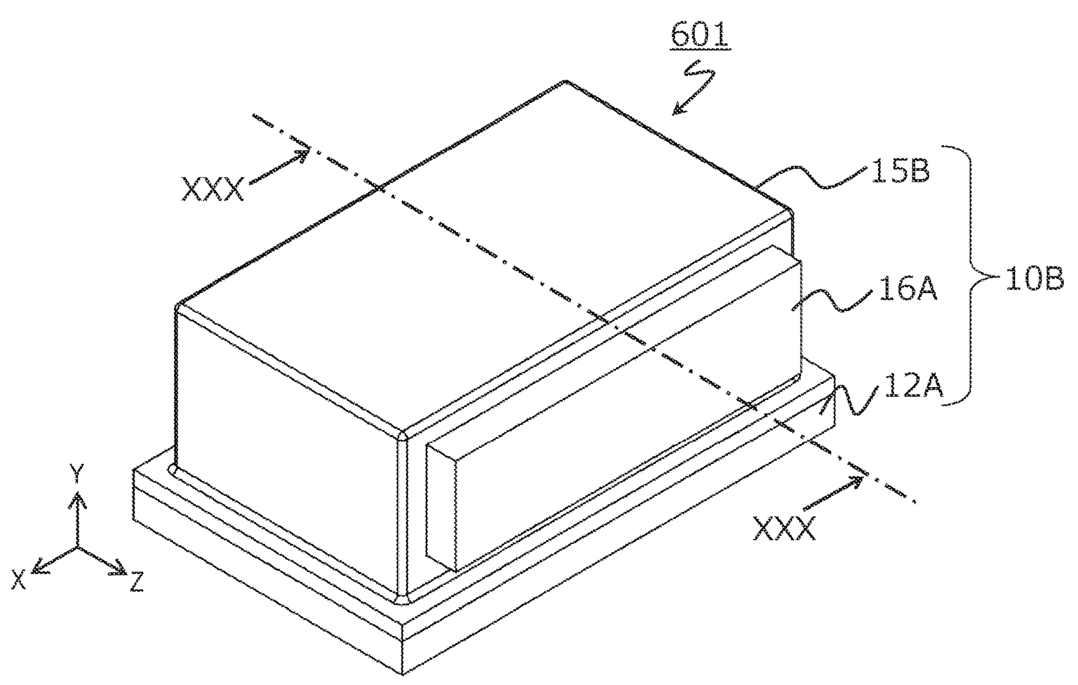
FIG. 29 is a schematic perspective view of a modified example of a light emitting device according to the sixth embodiment of the present disclosure.
Figure 30:
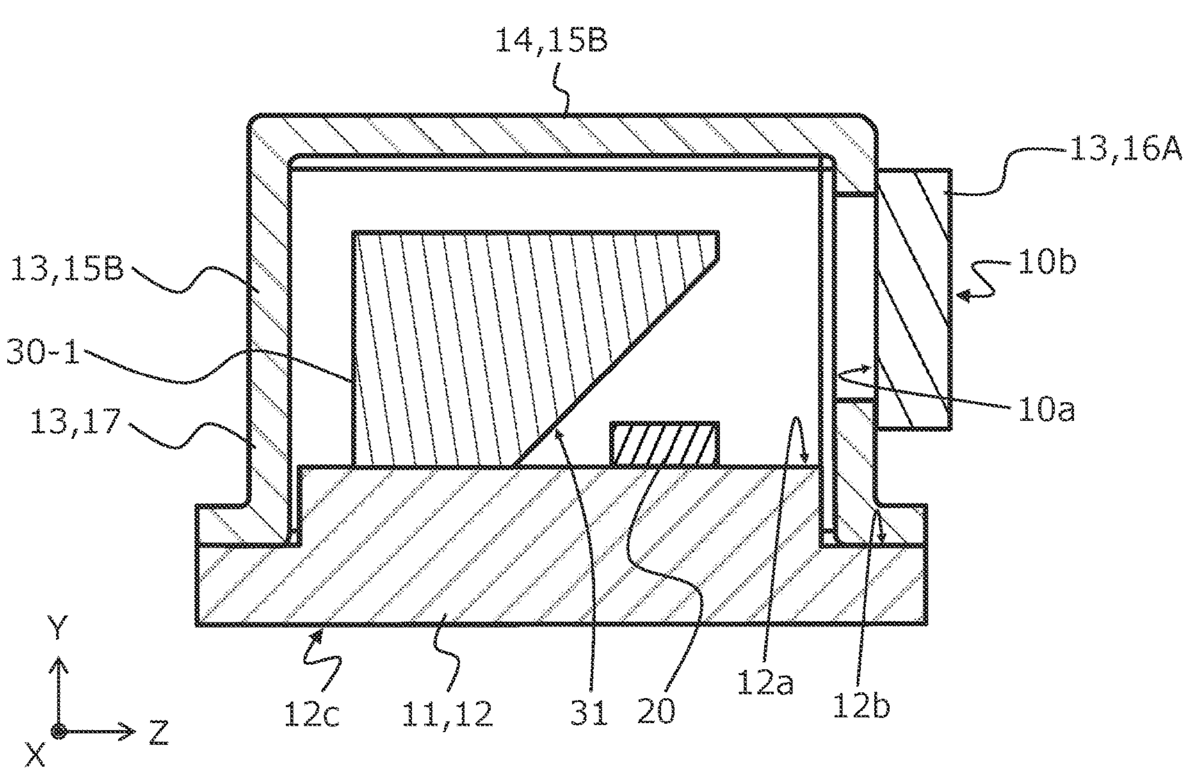
FIG. 30 is a schematic cross-sectional view of the light emitting device shown in FIG. 29 along a cross-sectional line XXX-XXX.

Next, with reference to FIG. 29 and FIG. 30, a light emitting device 601 according to a sixth embodiment will be described. FIG. 29 is a perspective view showing the light emitting device 601. FIG. 30 is a cross-sectional view of the light emitting device 601 along a cross-sectional line XXX-XXX in FIG. 29. Hereinafter, any aspects that are common to those of the light emitting device 600 may be omitted from description.

Package 10B

The light emitting device 601 includes a package 10B. The package 10B includes a substrate 12A, a cap 15B, and a sealing portion 16A. In the illustrated example, the substrate 12A includes a first upper surface 12*a*, a second upper surface 12*b*, a lower surface 12*c*, and a plurality of lateral surfaces. In a side view, as viewed from a perpendicular direction to one lateral surface, the substrate 12A appears to have a convex shape. In the illustrated example, the first upper surface 12*a* and the second upper surface 12*b* face in the same direction. On the other hand, the lower surface 12*c* faces in the opposite direction from the first upper surface 12*a* and the second upper surface 12*b*. The second upper surface 12*b* is located closer to the lower surface 12*c* than is the first upper surface 12*a*. Hereinafter, the direction from the lower surface 12*c* to the first upper surface 12*a* will be expressed as upward, and the opposite direction will be expressed as downward. The first upper surface 12*a*, the second upper surface 12*b*, and the lower surface 12*c* may be parallel to one another, for example.

In the illustrated example, the cap 15B is bonded to the second upper surface 12*b* of the substrate 12A, and extends upward. The cap 15B includes an opening on a lateral wall thereof, with the sealing portion 16A being provided on the opening. The substrate 12A, the cap 15B, and the sealing portion 16A together create a sealed space V. The cap 15B may be made of a ceramic, a metal, or the like as a main material, for example.

Note that, similarly to the light emitting device 600, the package 10A may be regarded as having a lower portion 11, lateral portions 13, and an upper portion 14. In the present embodiment, the substrate 12A is the lower portion 11. The lateral walls of the cap 15B are the lateral portions 13. The lateral portions 13 include the sealing portion 16A. A portion that connects to the lateral walls of the cap 15B and that is located upward of the substrate 12A is the upper portion 14.

Light Emitting Device 601

The one or more light-emitting elements 20 and the reflecting part 30-1 are disposed in the sealed space V. Light that is emitted from the upper surface(s) of the one or more light-emitting elements 20 (which are provided in the sealed space V) is reflected at the first reflection surface 31 of the reflecting part 30-1 and travels in a lateral direction. The light traveling in the lateral direction is incident on the inner lateral surface of the sealing portion 16A that is in contact with the sealed space V, and is emitted from the opposing outer lateral surface. Regarding the traveling direction of the light passing through the sealing portion 16A, the lateral surface of the substrate 12A that is the farthest ahead of light travel is located ahead of light travel relative to the light incident surface 10*a*. On the other hand, the light extraction surface 10*b* is located ahead of light travel relative to this lateral surface.

In the illustrated example, one or more light-emitting elements 20 and the reflecting part 30-1 are disposed on the first upper surface 12*a* of the substrate 12A. Thus, by disposing the one or more light-emitting elements 20 and the reflecting part 30-1 upward of the second upper surface 12*b* to which the cap 15B is bonded, the relative height of the light emitted from the sealing portion 16A can be elevated.

Light emitting devices according to embodiments of the present disclosure can be used in head-mounted displays, projectors, illuminations, displays, and the like.

What is claimed is:

1. A light emitting device comprising:

a package comprising an upper portion, a lower portion, and one or more lateral portions, the package having a closed space defined by the upper portion, the lower portion, and the one or more lateral portions;

a first light-emitting element having an upper surface and configured to have one or more emission points on the upper surface, the first light-emitting element being disposed on a mounting surface of the lower portion; and a reflecting part having:

a first reflection surface configured to reflect light emitted upward from the one or more emission points, and one or more bonding surfaces directly bonded to a lower surface of the upper portion and/or the mounting surface; wherein:

the one or more lateral portions include;

a first lateral portion having a light-transmitting portion, and a second lateral portion that is located on an opposite side from the first lateral portion with respect to the first light-emitting element;

the reflecting part is disposed in the closed space such that the first reflection surface is spaced apart from the second lateral portion;

light reflected from the first reflection surface is transmitted through the light-transmitting portion to be emitted outside; and in a direction normal to the mounting surface, a first distance between a lower surface of the upper portion and the mounting surface is equal to or greater than 1.5 times a second distance between the upper surface of the first light-emitting element and a midpoint of the first reflection surface.

2. The light emitting device of claim 1, wherein:

the one or more bonding surfaces of the reflecting part are bonded to the lower surface of the upper portion; and a main material of the reflecting part is silicon.

3. The light emitting device of claim 1, wherein:

the first reflection surface is connected to the upper portion and to the lateral portion.

4. The light emitting device of claim 3, wherein:

the upper portion, the second lateral portion, and the reflecting part are formed or assembled as a single body, with a reflection film being located on a surface of the reflecting part; and the first lateral portion has a surface on which an antireflection coating is located.

5. The light emitting device of claim 4, wherein:

the midpoint of the first reflection surface coincides with a first point, the first point being an intersection between the first reflection surface and an optical axis of light emitted from an emission point that is located at a center of the upper surface of the first light-emitting element or an emission point that is the closest to the center of the upper surface of the first light-emitting element.

6. The light emitting device of claim 1, further comprising:

a light-receiving element disposed on the mounting surface, the light-receiving element having a light-receiving surface; wherein:

the first lateral portion has a light incident surface on which light reflected from the first reflection surface is incident; and in a direction normal to the light incident surface, a distance between the first light-emitting element and the light-receiving element is smaller than a length of the first light-emitting element.

7. The light emitting device of claim 6, wherein:

the first light-emitting element and the light-receiving element are arrayed along the direction normal to the light incident surface; and in the direction normal to the light incident surface, the first light-emitting element is closer to the light incident surface than the light-receiving element is to the light incident surface.

8. The light emitting device of claim 7, wherein:

the reflecting part further includes a second reflection surface configured to reflect light that is emitted from the first light-emitting element and transmitted through the first reflection surface;

in a top view as viewed in a direction normal to the mounting surface, the first reflection surface overlaps the entire upper surface of the first light-emitting element, and the second reflection surface overlaps at least a portion of the light-receiving surface of the light-receiving element.

9. The light emitting device of claim 1, further comprising:

a lens member configured to collimate light that is emitted from the first light-emitting element and transmitted through the light-transmitting portion.

10. The light emitting device of claim 9, wherein:

in a direction normal to the mounting surface, the lens member is disposed on a same plane as the mounting surface, or on a plane located below the mounting surface; and in the direction normal to the mounting surface, a lens optical axis of the lens member passes through an intersection between the first reflection surface and an optical axis of light that is emitted from the first light-emitting element.

11. The light emitting device of claim 10, further comprising:

a second light-emitting element configured to have one or more emission points from which light is emitted in a direction parallel to the mounting surface, the second light-emitting element being disposed on the mounting surface, wherein:

light emitted from the second light-emitting element is transmitted through the light-transmitting portion to be emitted outside.

12. The light emitting device of claim 11, wherein:

the first light-emitting element and the second light-emitting element are semiconductor laser elements; and the first light-emitting element is configured to emit blue or green light, and the second light-emitting element is configured to emit red light.

13. The light emitting device of claim 11, further comprising:

a submount disposed on the mounting surface; wherein:

the second light-emitting element is disposed on an upper surface of the submount; and in the direction normal to the mounting surface, a distance between the mounting surface and the upper surface of the submount is greater than a distance between the mounting surface and a lowest point of the first reflection surface.

14. A light emitting device comprising:

a package comprising an upper portion, a lower portion, and one or more lateral portions, the package having a closed space defined by the upper portion, the lower portion, and the one or more lateral portions;

a first light-emitting element having an upper surface and configured to have one or more emission points on the upper surface, the first light-emitting element being disposed on a mounting surface of the lower portion; and a reflecting part having:

a first reflection surface configured to reflect light emitted upward from the one or more emission points, and a second reflection surface configured to reflect light that is emitted from the first light-emitting element and transmitted through the first reflection surface; and a light-receiving element disposed on the mounting surface, the light-receiving element having a light-receiving surface; wherein:

the first reflection surface is located within the closed space;

the one or more lateral portions include a first lateral portion having:

a light incident surface on which light reflected from the first reflection surface is incident, and a light-transmitting portion;

light reflected from the first reflection surface is transmitted through the light-transmitting portion to be emitted outside; and in a direction normal to the mounting surface, a first distance between a lower surface of the upper portion and the mounting surface is equal to or greater than 1.5 times a second distance between the upper surface of the first light-emitting element and a midpoint of the first reflection surface;

the first light-emitting element and the light-receiving element are arrayed along the direction normal to the light incident surface;

in a direction normal to the light incident surface, a distance between the first light-emitting element and the light-receiving element is smaller than a length of the first light-emitting element, and the first light-emitting element is closer to the light incident surface than the light-receiving element is to the light incident surface, and in a top view as viewed in a direction normal to the mounting surface, the first reflection surface overlaps the entire upper surface of the first light-emitting element, and the second reflection surface overlaps at least a portion of the light-receiving surface of the light-receiving element.

15. The light emitting device of claim 14, wherein:

the reflecting part further has one or more bonding surfaces;

the one or more bonding surfaces of the reflecting part are bonded to the lower surface of the upper portion; and a main material of the reflecting part is silicon.

16. The light emitting device of claim 14, further comprising:

a lens member configured to collimate light that is emitted from the first light-emitting element and transmitted through the light-transmitting portion.

17. A light emitting device comprising:

a package comprising an upper portion, a lower portion, and one or more lateral portions, wherein the package has a closed space defined by the upper portion, the lower portion, and the one or more lateral portions, and the one or more lateral portions include a first lateral portion having a light-transmitting portion;

a first light-emitting element having an upper surface and configured to have one or more emission points on the upper surface, the first light-emitting element being disposed on a mounting surface of the lower portion; and a reflecting part having a first reflection surface configured to reflect light emitted upward from the one or more emission points; and a lens member configured to collimate light that is emitted from the first light-emitting element and transmitted through the light-transmitting portion; wherein:

the first reflection surface is located within the closed space;

light reflected from the first reflection surface is transmitted through the light-transmitting portion to be emitted outside;

in a direction normal to the mounting surface, a first distance between a lower surface of the upper portion and the mounting surface is equal to or greater than 1.5 times a second distance between the upper surface of the first light-emitting element and a midpoint of the first reflection surface;

in a direction normal to the mounting surface, the lens member is disposed on a same plane as the mounting surface, or on a plane located below the mounting surface; and in the direction normal to the mounting surface, a lens optical axis of the lens member passes through an intersection between the first reflection surface and an optical axis of light that is emitted from the first light-emitting element.

18. The light emitting device of claim 17, wherein:

the reflecting part further has one or more bonding surfaces;

the one or more bonding surfaces of the reflecting part are bonded to the lower surface of the upper portion; and a main material of the reflecting part is silicon.

19. The light emitting device of claim 17, further comprising:

a light-receiving element disposed on the mounting surface, the light-receiving element having a light-receiving surface; wherein:

the first lateral portion has a light incident surface on which light reflected from the first reflection surface is incident; and in a direction normal to the light incident surface, a distance between the first light-emitting element and the light-receiving element is smaller than a length of the first light-emitting element.

20. The light emitting device of claim 19, wherein:

the first light-emitting element and the light-receiving element are arrayed along the direction normal to the light incident surface; and in the direction normal to the light incident surface, the first light-emitting element is closer to the light incident surface than the light-receiving element is to the light incident surface.

* * * * *